US010314171B1

(12) United States Patent
Aleksov et al.

(10) Patent No.: US 10,314,171 B1
(45) Date of Patent: Jun. 4, 2019

(54) PACKAGE ASSEMBLY WITH HERMETIC CAVITY

(71) Applicant: Intel Corporation, Santa Clara, CA (US)

(72) Inventors: Aleksandar Aleksov, Chandler, AZ (US); Feras Eid, Chandler, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/859,321

(22) Filed: Dec. 29, 2017

(51) Int. Cl.
H05K 1/18 (2006.01)
H05K 3/46 (2006.01)
H05K 1/03 (2006.01)
H05K 1/09 (2006.01)
H05K 3/18 (2006.01)
H05K 3/34 (2006.01)

(52) U.S. Cl.
CPC .......... *H05K 1/186* (2013.01); *H05K 1/0306* (2013.01); *H05K 1/09* (2013.01); *H05K 1/183* (2013.01); *H05K 3/18* (2013.01); *H05K 3/34* (2013.01); *H05K 3/4697* (2013.01); *H05K 2201/098* (2013.01); *H05K 2201/09136* (2013.01); *H05K 2201/10522* (2013.01); *H05K 2201/10545* (2013.01); *H05K 2201/10636* (2013.01); *H05K 2201/10734* (2013.01)

(58) Field of Classification Search
CPC ........ H05K 3/4697; H05K 3/34; H05K 3/186; H05K 3/18
See application file for complete search history.

(56) References Cited

U.S. PATENT DOCUMENTS

| 5,278,447 | A | * | 1/1994 | Vongfuangfoo | ...... H01L 23/562 257/678 |
| 5,581,028 | A | * | 12/1996 | Barth | ........................ G01F 1/28 73/204.26 |
| 7,170,155 | B2 | * | 1/2007 | Heck | ...................... B81B 7/007 174/262 |
| 8,790,504 | B2 | * | 7/2014 | Kodani | ................... C25D 5/022 205/118 |
| 9,663,353 | B2 | | 5/2017 | Ofner et al. | |
| 2003/0087469 | A1 | * | 5/2003 | Ma | ......................... B81C 1/0023 438/51 |

(Continued)

OTHER PUBLICATIONS

Extended European Search Report for European Patent Application No. 18209341.9 dated Mar. 28, 2019, 6 pgs.

*Primary Examiner* — Hoa C Nguyen
(74) *Attorney, Agent, or Firm* — Schwabe, Williamson & Wyatt P.C.

(57) ABSTRACT

Apparatuses, systems and methods associated with hermetic encapsulation for package assemblies are disclosed herein. In embodiments, a package assembly may include a package substrate that includes a guard ring, wherein the guard ring extends from a surface of the package substrate and around a circumference of a cavity. The package assembly may further include a component coupled to the guard ring by a solder joint along an entirety of the guard ring, wherein the cavity is located between the package substrate and the component and the cavity is hermetically-sealed via the guard ring and the solder joint. Other embodiments may be described and/or claimed.

20 Claims, 19 Drawing Sheets

(56) References Cited

U.S. PATENT DOCUMENTS

| | | |
|---|---|---|
| 2005/0269688 A1 | 12/2005 | Shiv |
| 2009/0151972 A1* | 6/2009 | Potter ................ B81C 1/00269 174/50.5 |
| 2013/0249109 A1 | 9/2013 | Ma et al. |
| 2016/0099201 A1* | 4/2016 | Choi .................... H01L 23/481 257/621 |
| 2017/0170130 A1* | 6/2017 | Kaneda .............. H01L 21/4857 |

* cited by examiner

PACKAGE ASSEMBLY WITH HERMETIC CAVITY

TECHNICAL FIELD

The present disclosure relates to the field of electronic circuits. More particularly, the present disclosure relates to hermetic encapsulation for package assemblies.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As system on package assemblies continue to advance, devices that may be included in system on package assemblies have developed environmental requirements for proper operation and/or highest levels of operation. Some devices, such as devices with moving parts, microelectromechanical systems, resonators, gyroscopes, and motion sensors, may benefit from being located within a controlled, unchanging environment. In particular, the devices may benefit from being located within a portion of the system on package that includes a vacuum, a special gas atmosphere, a controlled humidity, or other similar environmental features.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
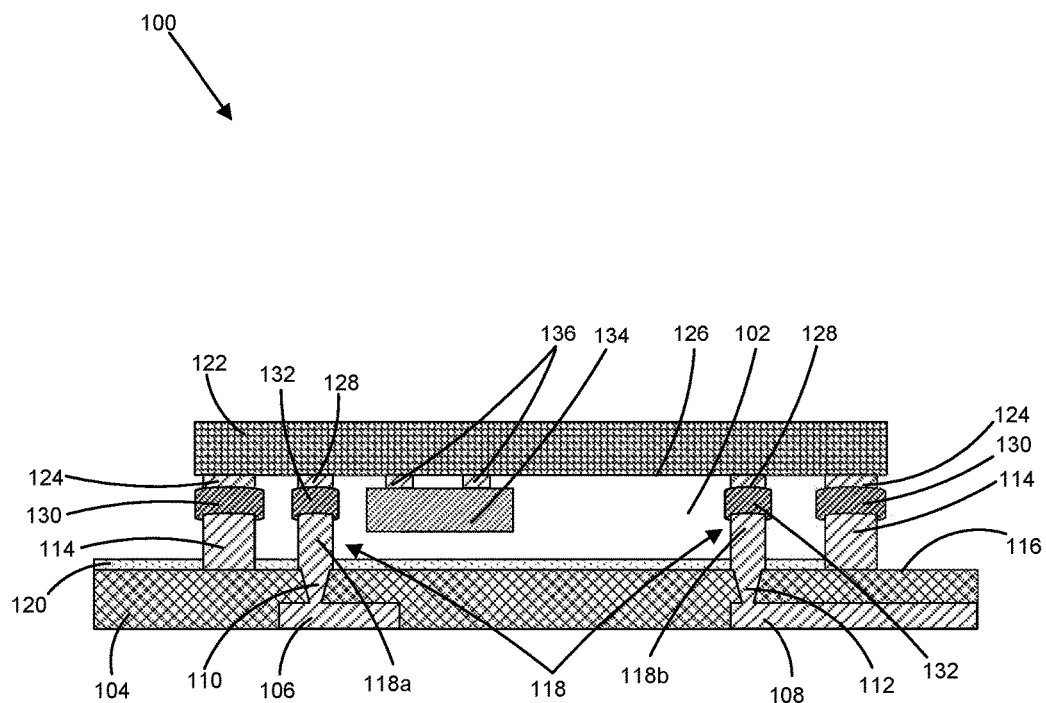
FIG. 1 illustrates a cross-sectional view an example package assembly with hermetic cavity, according to various embodiments.

Apparatuses, systems and methods associated with hermetic encapsulation for package assemblies are disclosed herein. In embodiments, a package assembly may include a package substrate that includes a guard ring, wherein the guard ring extends from a surface of the package substrate and around a circumference of a cavity. The package assembly may further include a component coupled to the guard ring by a solder joint along an entirety of the guard ring, wherein the cavity is located between the package substrate and the component and the cavity is hermetically-sealed via the guard ring and the solder joint.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a cross-sectional view an example package assembly 100 with hermetic cavity 102, according to various embodiments. The package assembly 100 may include a package substrate 104. The package substrate 104 may include a dielectric material with one or more conductive features located within the dielectric material, wherein the conductive features may be utilized for routing signals through the package substrate 104. The dielectric material may include silicon, oxygen, carbon, or some combination thereof, and may be a silicate-filled epoxy in some embodiments. The conductive features may include traces, vias, contacts, and/or other similar conductive interconnects. For example, the package substrate 104 may include a first trace 106 and a second trace 108. The package substrate 104 may further include a first via 110 coupled to the first trace 106 and a second via 112 coupled to the second trace 108 in the illustrated embodiment. In some embodiments, the package substrate 104 may include one or more organic buildup films coupled together to produce the package substrate 104.

The package substrate 104 may include a guard ring 114 that extends from a surface 116 of the package substrate 104. The guard ring 114 may extend perpendicularly from the surface 116 of the package substrate 104, at an angle to the surface 116 of the package substrate 104, or some combination thereof. The guard ring 114 may extend around the hermetic cavity 102 and encircle the hermetic cavity 102. In the illustrated embodiment, the guard ring 114 may form a rectangle (as shown by the second portion 204 (FIG. 2)) around the hermetic cavity 102. However, it is to be understood that the guard ring 114 may form other shapes around the hermetic cavity 102 in other embodiments, including a circle, oval, ellipse, the shapes shown in FIG. 5, or some combination thereof. Further, in some embodiments, the shape of the guard ring 114 may be selected based on components and/or shapes of the components to be positioned within the hermetic cavity 102.

The guard ring 114 may include a hermetic material or hermetic materials. For example, the guard ring 114 may include copper, nickel, palladium, gold, indium, tin, or some combination thereof. In some embodiments, the guard ring 114 may include a copper region with a surface finish region (which may include nickel, palladium, gold, or some combination thereof) and/or a solder region (which may include tin, indium, gold, or some combination thereof) located on the copper region. Embodiments of structures for the guard ring 114 are shown and described further in relation to FIG. 3. The guard ring 114 may provide some hermeticity to the hermetic cavity 102, preventing elements from passing through the guard ring 114 into or out of the hermetic cavity 102.

The package substrate 104 may further include one or more interconnect elements 118 that extend from the surface 116 of the package substrate 104. The interconnect elements 118 may extend perpendicularly from the surface 116 of the package substrate 104, at an angle to the surface 116 of the package substrate 104, or some combination thereof. The interconnect elements 118 may be located within the guard ring 114. In other embodiments, the interconnect elements 118 may be located outside of the guard ring 114, or a first portion of the interconnect elements 118 may be located within the guard ring 114 and a second portion of the interconnect elements 118 may be located outside of the guard ring 114. Further, the interconnect elements 118 may be implemented as part of the guard ring 114, wherein a portion of the guard ring 114 may include and/or operate as one or more of the interconnect elements 118.

The interconnect elements 118 may include a conductive material and may be utilized to route signals between the package substrate 104 and other components. For example, a first interconnect element 118a may be coupled to the first via 110 and a second interconnect element 118b may be coupled to the second via 112. The first interconnect element 118a and the second interconnect element 118b may be utilized to routes signals of the first via 110 and the second via 112, respectively. Further, the interconnect elements 118 may include a hermetic material, such as copper, nickel, palladium, gold, indium, tin, or some combination thereof. The interconnect elements 118 may provide some hermeticity to the hermetic cavity 102, preventing elements from passing through the interconnect elements 118 into and out of the hermetic cavity 102.

The package assembly 100 may further include a hermetic region 120 located on the surface 116 of the package substrate 104. The hermetic region 120 may include a hermetic material, which may be a dielectric material and/or an inorganic dielectric material in some embodiments. In particular, the hermetic region 120 may include silicon, oxygen, nitrogen, rubidium, bromine, lithium, fluorine, barium, titanium, hafnium, tantalum, tungsten, zirconium, or some combination thereof. The hermetic region 120 may provide some hermeticity to the hermetic cavity 102, preventing elements from passing through the package substrate 104 into and out of the hermetic cavity 102.

The hermetic region 120 may extend across the surface 116 of the package substrate 104 within the guard ring 114. In particular, the hermetic region 120 may cover an entirety of the surface 116 of the package substrate 104 within the guard ring 114, with the exception of portions of the surface 116 from which the interconnect elements 118 extend. The interconnect elements 118 may extend through the hermetic region 120, wherein the portion of the interconnect elements 118 that extends through the hermetic region 120 may include hermetic material. In some embodiments, the hermetic region 120 may further extend across a portion of the surface 116 of the package substrate 104 outside of the guard ring 114 in some embodiments.

The package assembly 100 may further include a first component 122. The first component 122 may be located on the guard ring 114 and/or the interconnect elements 118. In particular, the first component 122 may be located on opposite ends of the guard ring 114 and/or the interconnect elements 118 from where the surface 116 of the package substrate 104 is located.

The first component 122 may include a semiconductor component. In some embodiments, the first component 122 may be a device or system with moving elements (DME), some portion thereof, a radio frequency (RF) component or system, some portion thereof, or some combination thereof. The first component 122 may include a hermetic material. For example, the first component 122 may include copper, nickel, palladium, gold, indium, tin, silicon, oxygen, nitrogen, rubidium, bromine, lithium, fluorine, barium, titanium, hafnium, tantalum, tungsten, zirconium, or some combination thereof. The first component 122 may provide some hermeticity to the hermetic cavity 102, preventing elements from passing through the first component 122 into and out of the hermetic cavity 102.

The first component 122 may further include a guard ring 124 that extends from a surface 126 of the first component 122. The guard ring 124 may extend perpendicularly from the surface 126 of the first component 122, at an angle to the surface 126 of the first component 122, or some combination thereof. The guard ring 124 may extend around the hermetic cavity 102 and encircle the hermetic cavity 102. The guard ring 124 of the first component 122 may be aligned with the guard ring 114 of the package substrate 104. In particular, an end of the guard ring 124 opposite from the surface 126 of the first component 122 may be aligned with an end of the guard ring 114 opposite from the surface 116 of the package substrate 104. Further, the shape of the guard ring 124 may be the same shape as the guard ring 114.

The package assembly 100 may further include a solder joint 130 located between the guard ring 124 of the first component 122 and the guard ring 114 of the package substrate 104. The solder joint 130 may extend around an entirety of the area between the guard ring 124 and the guard ring 114, and may couple the guard ring 124 to the guard ring 114. In particular, the solder joint 130 may hermetically couple the guard ring 124 to the guard ring 114, preventing elements from passing through the area between the guard ring 124 and the guard ring 114. The solder joint 130 may provide some hermeticity to the hermetic cavity 102, preventing elements from passing through the solder joint 130 into and out of the hermetic cavity 102.

The first component 122 may further include one or more contacts 128. The contacts 128 may extend from the surface 126 of the first component 122 and may align with the interconnect elements 118 of the package substrate 104. In particular, an end of each of the contacts 128 may align with an end of a corresponding interconnect element of the interconnect elements 118. Solder joints 132 may be located between each of the contacts 128 and the corresponding interconnect elements 118, wherein the solder joints 132 may couple each of the contacts 128 to the corresponding interconnect elements 118. The solder joints 132 coupling the contacts 128 to the corresponding interconnect elements 118 may allow for signals to conduct between the contacts 128 and the corresponding interconnect elements 118. Accordingly, any electrical signals (including direct current signals and/or alternating current signals) may be conducted, through the solder joints 132, between the contacts 128 and the interconnect elements 118.

The contacts 128 may include a conductive material and may be utilized to route signals between the first component 122 and the package substrate 104. Further, the contacts 128 may include a hermetic material, such as copper, nickel, palladium, gold, indium, tin, or some combination thereof. The contacts 128 may provide some hermeticity to the hermetic cavity 102, preventing elements from passing through contacts 128 into and out of the hermetic cavity 102.

The hermetic cavity 102 may be located within an area between the first component 122 and the package substrate 104, and may be encircled by the guard ring 114 and the guard ring 124. The height of the hermetic cavity 102 (measured between the surface 116 of the package substrate 104 and the surface 126 of the first component 122) may be selected to be a certain height and/or may be selected based on components located within the hermetic cavity 102. In some embodiments, the height of the hermetic cavity 102 may be between 5 micrometers and 100 micrometers. The height of the guard ring 114, the guard ring 124, the interconnect elements 118, the contacts 128, or some combination thereof, may be selected to provide the desired height of the hermetic cavity 102.

The hermetic cavity 102 may be hermetically-sealed due to the hermeticity provided by the first component 122, the guard ring 124, the guard ring 114, the solder joint 130, the hermetic region 120, and the interconnect elements 118. The hermetic cavity 102 may be hermetically-sealed with certain chemicals, or lack thereof, located within the hermetic cavity 102. For example, the hermetic cavity 102 may be hermetically-sealed within a vacuum in some embodiments, wherein the hermetic cavity 102 may maintain the vacuum after being hermetically-sealed. Further, the hermetic cavity 102 may be hermetically-sealed with a gas, liquid, gel, or some combination thereof, located within hermetic cavity 102, wherein the hermetic cavity 102 may maintain the gas, liquid, gel, or combination thereof, within the hermetic cavity 102 after being hermetically-sealed. In some embodiments, a humidity within the hermetic cavity 102 may be controlled during hermetical sealing of the hermetic cavity 102, wherein the hermetic cavity may maintain the humidity level after being hermetically-sealed.

The package assembly 100 may further include a second component 134 located within the hermetic cavity 102. The second component 134 may be coupled to the first component 122 via one or more solder joints 136. The solder joints 136 may have a higher melting point temperature than the solder joint 130 and the solder joints 132, which may allow the solder joint 130 and the solder joints 132 to be reflowed at a certain temperature while the solder joints 136 remain solidified. In other embodiments, the solder joints 136 may be replaced by contacts or other interconnect features between the first component 122 and the second component 134. Further, the second component 134 may be coupled to the package substrate 104, both the first component 122 and the package substrate 104, the interconnect elements 118, the guard ring 114, the guard ring 124, or some combination thereof, in other embodiments.

The second component 134 may include a DME, some portion thereof, an RF component or system, some portion thereof, or a combination thereof. In some embodiments, the first component 122 and the second component 134 may be parts of a same DME, or RF component or system. The second component 134 may include moving parts and/or microelectromechanical systems (MEMS). For example, the second component 134 may include a resonator, a gyroscope, a motion sensor, or some combination thereof. Having the second component 134 located within the controlled environment of hermetic cavity 102 may improve operation of the second component 134 and/or maintain operation of the second component 134 better than if the second component 134 was located outside of the hermetic cavity 102 in an uncontrolled environment. For example, in embodiments where the second component 134 has moving parts, having the second component 134 located within a vacuum maintained by the hermetic cavity 102 may avoid dampening effects that may be present in uncontrolled environments.

Figure 2:
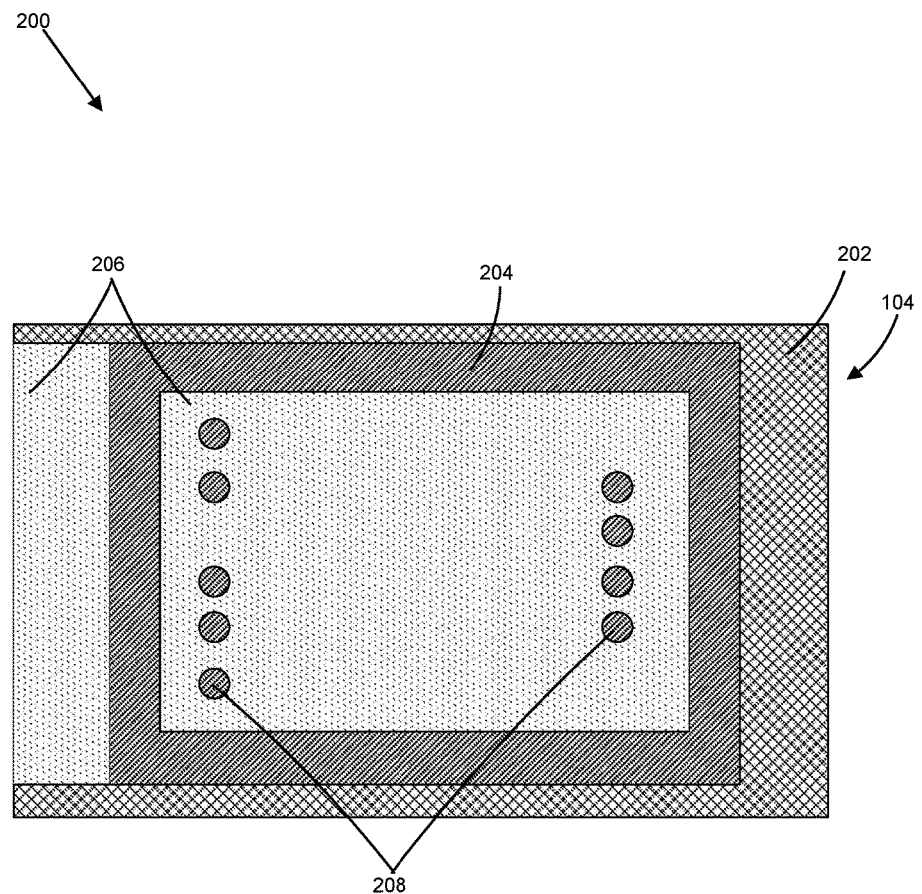
FIG. 2 illustrates a top view representation of the example package substrate of FIG. 1, according to various embodiments.

FIG. 2 illustrates a top view representation 200 of the example package substrate 104 of FIG. 1, according to various embodiments. In particular, the representation 200 represents locations where features described in FIG. 1 may be located on and/or extend from the package substrate 104. The representation 200 illustrates the package substrate 104 from a top view of the package substrate 104 with different shading and/or patterns indicating portions of the package substrate 104 where the features are located on and/or extend from the package substrate 104, as described below.

The representation 200 may include a first portion 202 of the package substrate 104. The first portion 202 may not have any features described in relation to FIG. 1 located on and/or extending from the surface 116 (FIG. 1) of the package substrate 104.

The representation 200 may further include a second portion 204 of the package substrate 104. The second portion 204 indicates where the guard ring 114 (FIG. 1) may extend from the package substrate 104. In the illustrated embodiment, the second portion 204 is illustrated as a rectangle. However, it is to be understood that the second portion 204 may be the same shape as any of the shapes of which the guard ring 114 may be, as described in relation to FIG. 1, in other embodiments.

The representation 200 may further include a third portion 206. The third portion 206 indicates where the hermetic region 120 (FIG. 1) may be located on the package substrate 104. In the illustrated embodiment, the hermetic region 120 is located within the guard ring 114 (as represented by the second portion 204) and outside of the guard ring 114. In other embodiments, the hermetic region 120 may be located only within the guard ring 114.

The representation 200 may further include a fourth portion 208. In particular, the fourth portion 208 is indicated by the circles within the third portion 206. The fourth portion 208 indicates where the interconnect elements 118 (FIG. 1) may extend from the package substrate 104. In the illustrated embodiment, the interconnect elements 118 are located only within the guard ring 114. In other embodiments, the interconnect elements 118 may be located outside of the guard ring, may be located within the guard ring 114, implemented into the guard ring 114, or some combination thereof.

Figure 3:
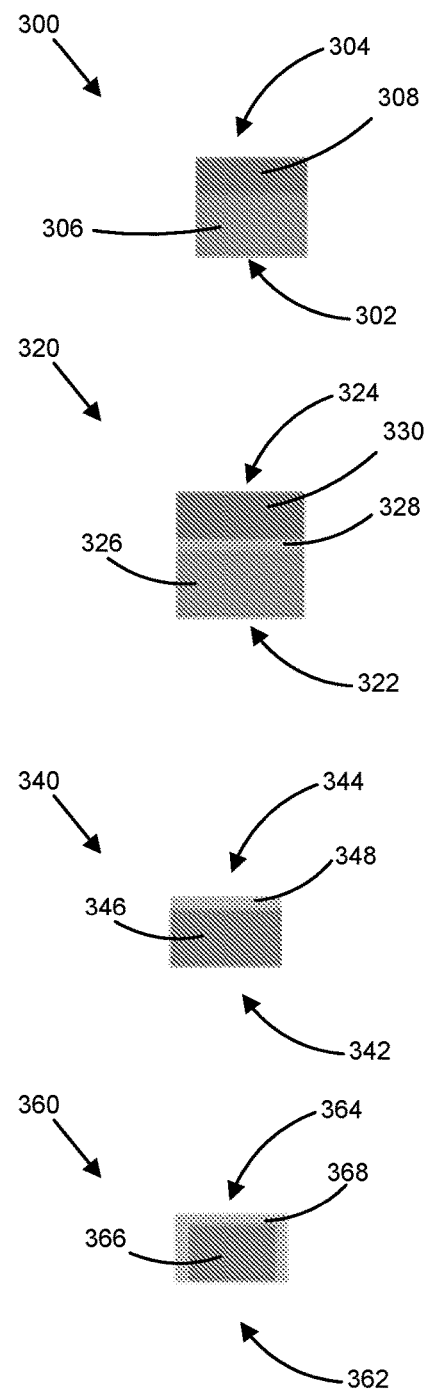
FIG. 3 illustrates a cross-sectional view of example guard ring structures, according to various embodiments.

FIG. 3 illustrates a cross-sectional view of example guard ring structures, according to various embodiments. In particular, the illustrated guard ring structures include some examples of arrangements that may be implemented by the guard ring 114 (FIG. 1), the guard ring 124 (FIG. 1), or both. In the description of the guard ring structures, reference is made to a first end and a second end of the guard ring structures. It is to be understood that the first end is the end of the guard ring structure that is to abut the surface 116 (FIG. 1) in regards to the guard ring 114 or the surface 126 (FIG. 1) in regards to the guard ring 124. Further, in the description of the guard ring structures, reference may be made to a solder region. It is to be understood that the solder region, or some portion thereof, may become the solder joint 130 (FIG. 1) in the package assembly 100.

A first guard ring structure 300 may have a first end 302 and a second end 304. The first guard ring structure 300 may include a copper region 306 and a solder region 308. The copper region 306 may be located at the first end 302. The solder region 308 may be located at the second end 304 and abut the copper region 306. In particular, the solder region 308 may be located on an end of the copper region 306 directed toward the second end 304. The copper region 306 may include copper. The solder region 308 may include tin, indium, gold, silver, bismuth, or some combination thereof.

A second guard ring structure 320 may have a first end 322 and a second end 324. The second guard ring structure 320 may include a copper region 326, a surface finish region 328, and a solder region 330. The copper region 326 may be located at the first end 322. The solder region 330 may be located at the second end 324. The surface finish region 328 may be located between the copper region 326 and the solder region 330, and may abut both the copper region 326, and the solder region 330. In particular, the surface finish region 328 may be located on the copper region 326, and the solder region 330 may be located on the surface finish region 328. The copper region 326 may include copper. The surface finish region 328 may include nickel, palladium, gold, silver, bismuth, or some combination thereof. The solder region 330 may include tin, indium, gold, or some combination thereof.

A third guard ring structure 340 may have a first end 342 and a second end 344. The third guard ring structure 340 may include a copper region 346 and a surface finish region 348. The copper region 346 may be located at the first end 342. The surface finish region 348 may be located at the second end 344 and abut the copper region 346. In particular, the surface finish region 348 may be located on an end of the copper region 346 directed toward the second end 344. The copper region 346 may include copper. The surface finish region 348 may include nickel, palladium, gold, or some combination thereof.

A fourth guard ring structure 360 may have a first end 362 and a second end 364. The fourth guard ring structure 360 may include a copper region 366 and a surface finish region 368. The copper region 366 may be located at the first end 362. The surface finish region 368 may be located at the second end 364 and may extend along the sides of the fourth guard ring structure 360, wherein the sides extend between the first end 362 and the second end 364. In particular, the surface finish region 368 may extend around the copper region 366 and may abut the copper region 366 on all sides of the copper region 366 with the exception of the side of the copper region 366 that abuts the first end 362.

Figure 4:
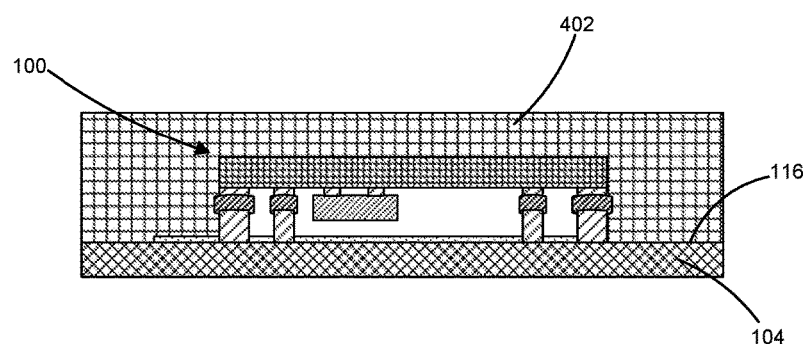
FIG. 4 illustrates a cross-sectional view of the example package assembly of FIG. 1 with overmold region, according to various embodiments.

FIG. 4 illustrates a cross-sectional view of the example package assembly 100 of FIG. 1 with overmold region 402, according to various embodiments. The overmold region 402 may be located on the surface 116 of the package substrate 104 and may encompass the guard ring 114, the guard ring 124, the solder joint 130, and the first component 122. The overmold region 402 may protect the package assembly 100, or some portion thereof, from damage due to external factors. Further, in some embodiments, the overmold region 402 may include a thermally-conductive material that facilitates transfer of heat away from the package assembly 100. The overmold region 402 may include silicon, carbon, hydrogen, oxygen, nitrogen, nickel, or some combination thereof.

Figure 5:
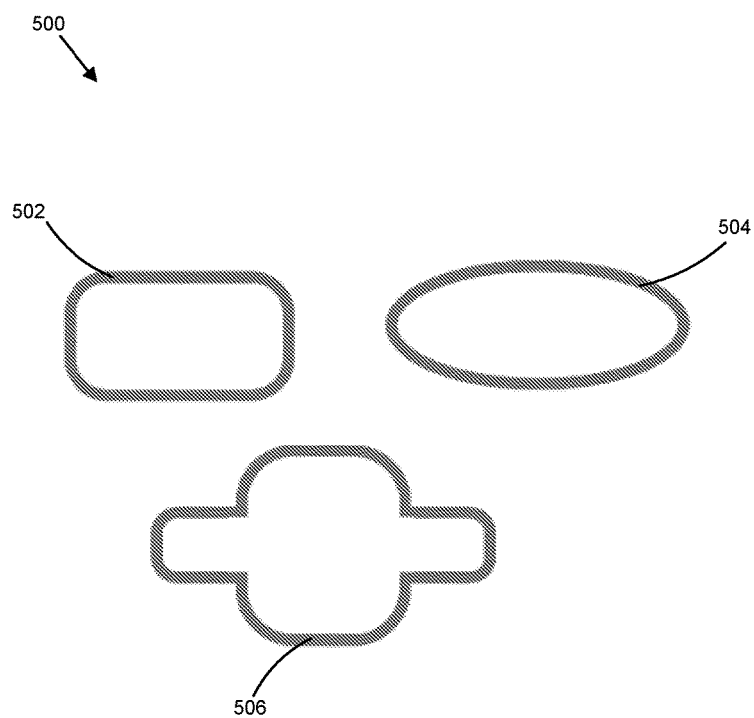
FIG. 5 illustrates example shapes for guard rings, according to various embodiments.

FIG. 5 illustrates example shapes 500 for guard rings, according to various embodiments. In particular, the guard ring 114 (FIG. 1) and/or the guard ring 124 (FIG. 1) may be a shape of any of the shapes 500. In particular, the shapes may include a rectangle 502 with curved corners, an oval 504, and an integrated square-rectangle shape 506. It is to be understood that these are merely a few example shapes for the guard rings, and the guard rings may be any shape described in relation to the guard ring 114 and/or the guard ring 124 in FIG. 1.

Figure 6A:
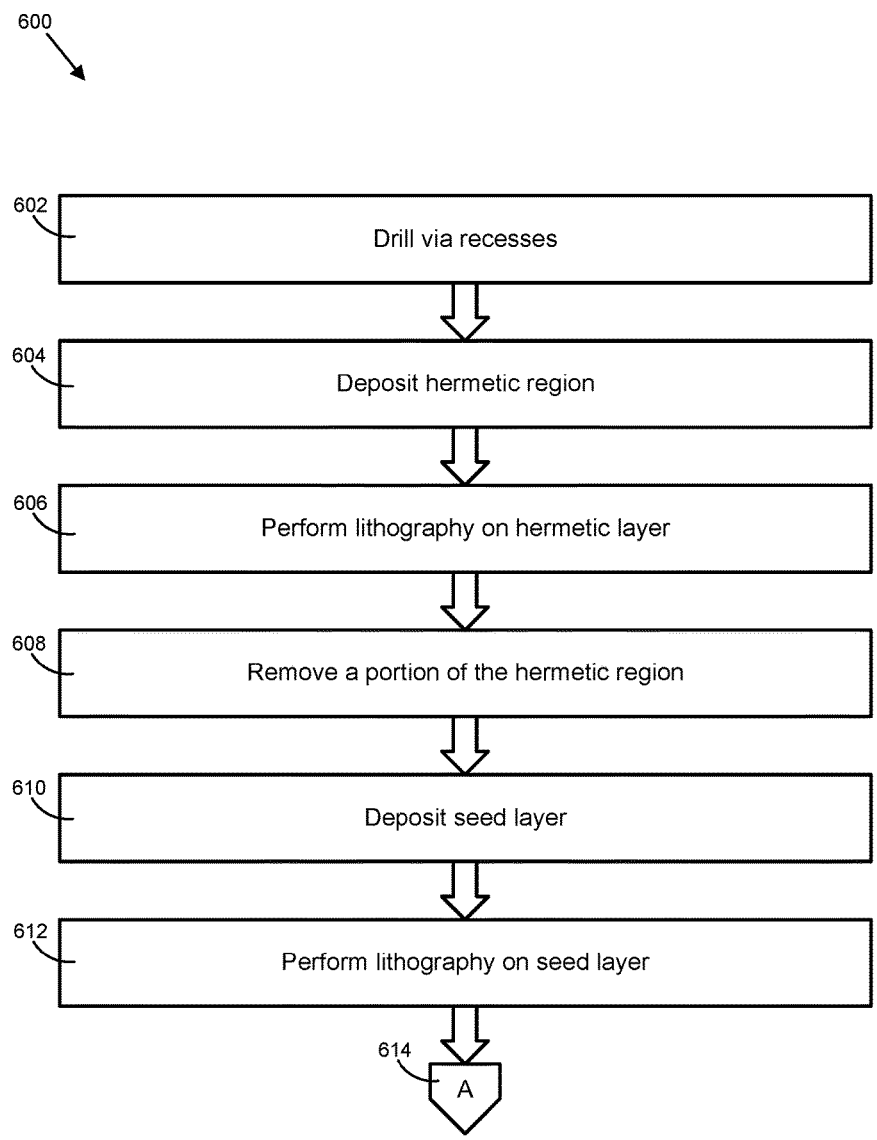
FIG. 6A illustrates a first portion of an example procedure for forming an example package assembly with hermetic cavity, according to various embodiments.

FIG. 6A illustrates a first portion of an example procedure 600 for forming an example package assembly with hermetic cavity, according to various embodiments. The procedure 600 may begin with a package substrate. The package substrate may include a dielectric material with one or more conductive features located within the package substrate. The dielectric material may include silicon, oxygen, carbon, or some combination thereof, and may be a silicate-filled epoxy in some embodiments. The package substrate may be formed of one or more organic buildup films coupled together and may include one or more layers.

Figure 7:
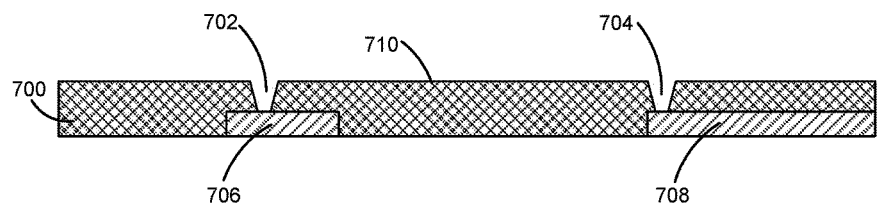
FIG. 7 illustrates a cross-sectional view of a resultant package substrate in accordance with stage 602 of the procedure of FIGS. 6A and 6B.

In stage 602, one of more via recesses may be drilled in the package substrate. In some embodiments, the via recesses may be drilled by a laser drill. The via recesses may be drilled to one or more conductive features located in the package substrate, the conductive feature being located in a layer of the package substrate away from a surface at which the drilling is occurring. FIG. 7 illustrates a cross-sectional view of a resultant package substrate 700 in accordance with stage 602. In particular, a first via recess 702 may be drilled in the package substrate 700 to a first conductive feature 706, and a second via recess 704 may be drilled in the package substrate 700 to a second conductive feature 708. The first via recess 702 and the second via recess 704 may be drilled in a surface 710 of the package substrate 700.

Figure 8:
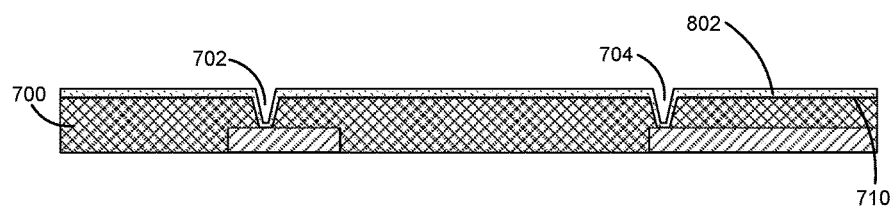
FIG. 8 illustrates a cross-sectional view of the resultant package substrate of FIG. 7 in accordance with stage 604 of the procedure of FIGS. 6A and 6B.

In stage 604, a hermetic region may be deposited on the package substrate. The hermetic region may include one or more of the features of the hermetic region 120 (FIG. 1). In particular, the hermetic region may be applied to the surface that the via recesses were drilled in, along the surfaces formed by the via recesses, or some combination thereof. FIG. 8 illustrates a cross-sectional view of the resultant package substrate 700 in accordance with stage 604. In particular, a hermetic region 802 may be applied to the surface 710 of the package substrate 700. Further, the hermetic region 802 may be applied to the sidewalls of the first via recess 702 and the second via recess 704, as well as to the portions of the first conductive feature 706 and the second conductive feature 708 exposed by the first via recess 702 and the second via recess 704, respectively.

In stage 606, a lithography procedure is applied to the hermetic region. For example, a resist (such as a photoresist) may be positioned on the hermetic region, wherein the resist has apertures located over certain portions of the hermetic region. The apertures may be located over portions of the hermetic region that correspond to the locations of the via recesses and/or intended locations of a guard ring. An exposure element (such as light) may be directed at the resist, and the portion of the hermetic region corresponding to the apertures of the resist may be exposed to the exposure element and may be developed.

Figure 9:
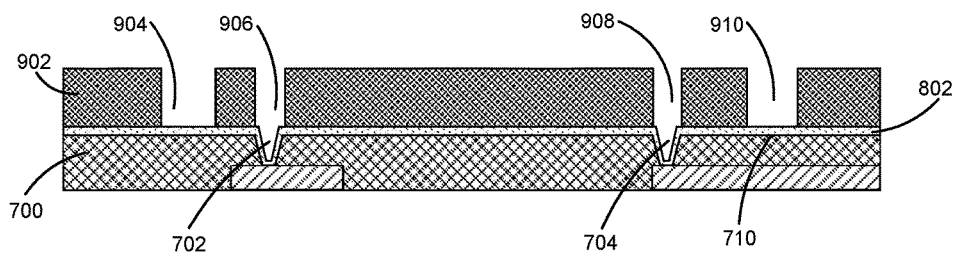
FIG. 9 illustrates a cross-sectional view of the package substrate of FIG. 7 in accordance with stage 606 of the procedure of FIGS. 6A and 6B.

FIG. 9 illustrates a cross-sectional view of the package substrate 700 in accordance with stage 606. A resist 902 may be positioned on the hermetic region 802. The resist 902 may have a first aperture 904, a second aperture 906, a third aperture 908, and a fourth aperture 910. The second aperture 906 and the third aperture 908 may be positioned over the first via recess 702 and the second via recess 704, respectively. The first aperture 904 and the fourth aperture 910 may be positioned over portions of the hermetic region 802 located on the surface 710 of the package substrate 700, wherein a guard ring is to extend from the surface 710 at the portions. The exposure element may then be directed at the resist 902, resulting in the portions of the hermetic region 802 corresponding to the first aperture 904, the second aperture 906, the third aperture 908, and the fourth aperture 910 to be exposed and developed.

In stage 608, a portion of the hermetic region may be removed. In particular, the portion, or portions, of the hermetic region exposed and developed in stage 606 may be removed. An excimer laser procedure, a dry etch procedure, a wet etch procedure, or another etch procedure may be applied to remove the portion, or portions, of the hermetic region. For example, the excimer laser procedure, the dry etch procedure, the wet etch procedure, or the other etch procedure may be performed while the resist applied in stage 606 is still positioned on the hermetic region, wherein the portion, or portions, of the hermetic region that are removed correspond to the apertures of the resist.

Figure 10:
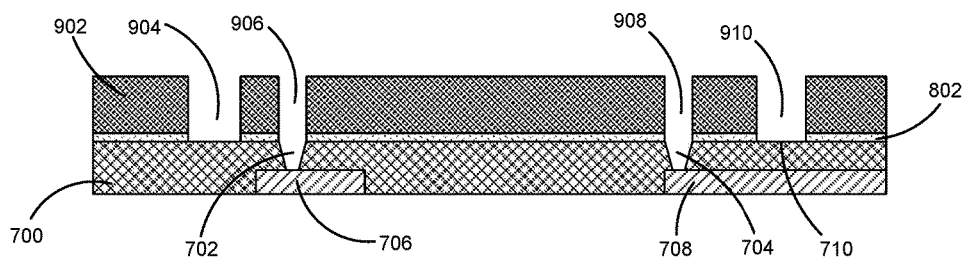
FIG. 10 illustrates a cross-sectional view of the resultant package substrate of FIG. 7 in accordance with stage 608 of the procedure of FIGS. 6A and 6B.

FIG. 10 illustrates a cross-sectional view of the resultant package substrate 700 in accordance with stage 608. The excimer laser procedure, dry etch procedure, wet etch procedure, or other etch procedures may have been applied while the resist 902 was still positioned on the hermetic region 802, which may have resulted in the portions of the hermetic region 802 corresponding to the first aperture 904, the second aperture 906, the third aperture 908, and the fourth aperture 910 being removed. Accordingly, the portions of the surface 710 corresponding to the first aperture 904 and the fourth aperture 910, the sidewalls of the first via recess 702 and the second via recess 704, and the portions of the first conductive feature 706 and the second conductive feature 708 that abut the first via recess 702 and the second via recess 704, respectively, may be exposed.

Figure 11:
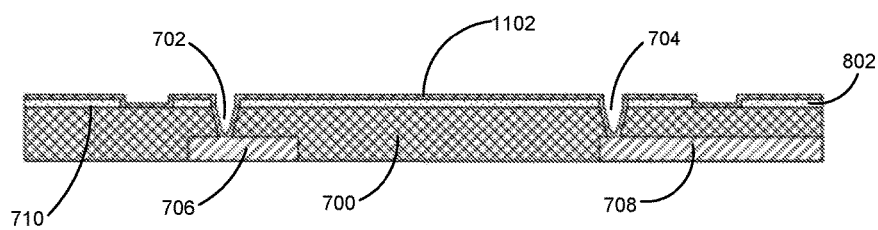
FIG. 11 illustrates a cross-sectional view of the resultant package substrate of FIG. 7 in accordance with stage 610 of the procedure of FIGS. 6A and 6B.

In stage 610, a seed layer may be deposited on the package substrate. In particular, the seed layer may be deposited on the hermetic region and the portions of the package substrate that were exposed in stage 608. The resist, positioned on the hermetic region in stage 606, may be removed prior to deposition of the seed layer. The seed layer may include copper and may be deposited by any seed layer deposition procedure. FIG. 11 illustrates a cross-sectional view of the resultant package substrate 700 in accordance with stage 610. The seed layer 1102 may extend across the hermetic region 802, the exposed portions of the surface 710 of the package substrate 700, the sidewalls of the first via recess 702 and the second via recess 704, the portions of the first conductive feature 706 and the second conductive feature 708 that abut the first via recess 702 and the second via recess 704, respectively, or some combination thereof.

In stage 612, a lithography procedure may be performed on the seed layer. For example, a resist (such as a photoresist) may be positioned on the seed layer, wherein the resist has apertures located over certain portions of the seed layer. In some embodiments, the resist utilized in stage 606 may be utilized again in stage 612. The apertures may be located over portions of the seed layer that correspond to the locations of the via recesses and/or intended locations of a guard ring. An exposure element (such as light) may be directed at the resist, and the portion of the seed region corresponding to the apertures of the resist may be exposed to the exposure element and may be developed.

Figure 12:
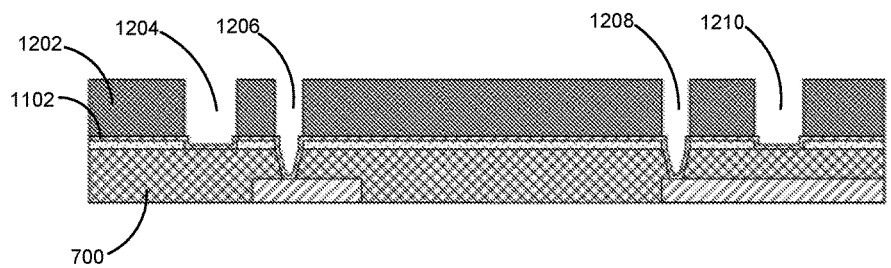
FIG. 12 illustrates a cross-sectional view of the package substrate of FIG. 7 in accordance with stage 612 of the procedure of FIGS. 6A and 6B.

FIG. 12 illustrates a cross-sectional view of the package substrate 700 in accordance with stage 612. A resist 1202 may be positioned on the seed layer 1102. The resist 1202 may have a first aperture 1204, a second aperture 1206, a third aperture 1208, and a fourth aperture 1210. The second aperture 1206 and the third aperture 1208 may be positioned over the first via recess 702 and the second via recess 704, respectively. The first aperture 1204 and the fourth aperture 1210 may be positioned over portions of the seed layer 1102 located on the surface 710 of the package substrate 700, wherein a guard ring is to extend from the surface 710 at the portions. The exposure element may then be directed at the resist 1202, resulting in the portions of the seed layer 1102 corresponding to the first aperture 1204, the second aperture 1206, the third aperture 1208, and the fourth aperture 1210 to be exposed and developed.

Figure 6B:
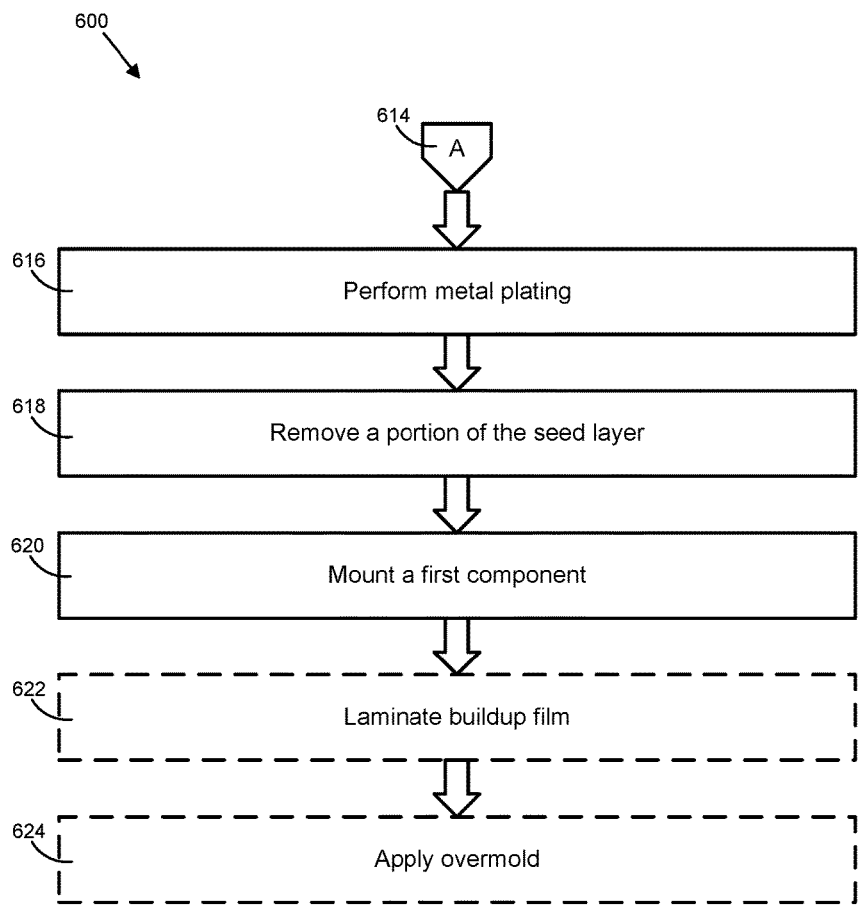
FIG. 6B illustrates a second portion of the example procedure of FIG. 6A for forming an example package assembly with hermetic cavity, according to various embodiments.

The procedure 600 may proceed from stage 612, illustrated in FIG. 6A, to stage 616, illustrated in FIG. 6B. In particular, connector 614 may indicate a link between FIG. 6A and FIG. 6B.

FIG. 6B illustrates a second portion of the example procedure 600 for forming an example package assembly with hermetic cavity, according to various embodiments. In stage 616, a metal plating procedure may be performed. The metal plating procedure may be performed with the resist from stage 612 still positioned on the seed layer. The metal plating procedure may result in a guard ring and/or one or more interconnect elements being formed on the portions of the surface of the package substrate exposed by the apertures of the resist. The metal plating procedure may further include forming solder regions on the guard ring and/or one or more interconnect elements. The resist may be removed after the metal plating procedure has been completed. In some embodiments, the metal plating procedure of stage 616 may be replaced by a cold spray process, which may result in the guard ring and/or the one or more interconnect elements being formed on portions of the surface of the package substrate.

Figure 13:
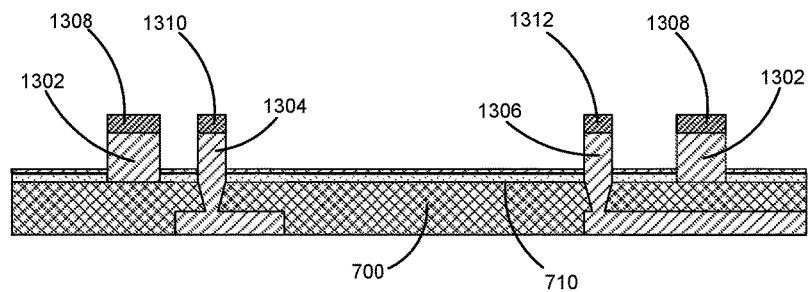
FIG. 13 illustrates a cross-sectional view of the resultant package substrate of FIG. 7 in accordance with stage 616 of the procedure of FIGS. 6A and 6B.

FIG. 13 illustrates a cross-sectional view of the resultant package substrate 700 in accordance with stage 616. The package substrate 700 may include a guard ring 1302, a first interconnect element 1304, and a second interconnect element 1306 formed by the metal plating procedure. The guard ring 1302 may include one or more of the features of the guard ring 114 (FIG. 1). The first interconnect element 1304 and the second interconnect element 1306 may each include one or more of the features of the interconnect elements 118 (FIG. 1). The package substrate 700 may further include a first solder region 1308 located on an end of the guard ring 1302 opposite to the surface 710 of the package substrate 700, the first solder region 1308 formed by the metal plating procedure. The package substrate 700 may further include a second solder region 1310 and a third solder region 1312 located on the first interconnect element 1304 and the second interconnect element 1306, respectively, the second solder region 1310 and the third solder region 1312 formed by the metal plating procedure. The first solder region 1308, the second solder region 1310, and the third solder region 1312 may each include one or more features of the solder region 308 (FIG. 3) and/or the solder region 330 (FIG. 3).

In stage 618, a portion of the seed layer may be removed. In particular, the portion, or portions, of the seed layer not exposed and developed in stage 612 may be removed. An excimer laser procedure, a dry etch procedure, a wet etch procedure, or another etch procedure may be applied to remove the portion, or portions, of the seed layer.

Figure 14:
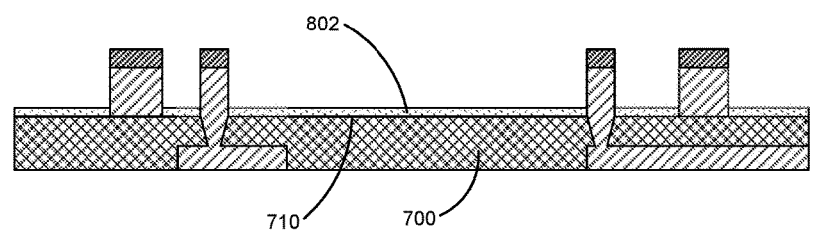
FIG. 14 may illustrate a cross-sectional view of the resultant package substrate of FIG. 7 in accordance with stage 618 of the procedure of FIGS. 6A and 6B.

FIG. 14 may illustrate a cross-sectional view of the resultant package substrate 700 in accordance with stage 618. In particular, the portions of the seed layer 1102 (FIG. 11) remaining exposed after the metal plating procedure of stage 616 may have been removed. Accordingly, the hermetic region 802 on the surface 710 of the package substrate 700 may be exposed.

In stage 620, a first component may be mounted to the package substrate. The first component may include one or more of the features of the first component 122 (FIG. 1). Mounting of the first component on the package substrate may produce a package assembly, such as the package assembly 100 (FIG. 1). Mounting the first component to the package substrate may include positioning the first component on the package substrate with a guard ring of the first component aligned with the guard ring of the package substrate and/or contacts of the first component aligned with the interconnect elements of the package substrate. Once the first component has been positioned on the package substrate, a reflow procedure may occur that results in solder joints being formed between the guard ring of the first component and the guard ring of the package substrate, and/or between the contacts of the first component and the interconnect elements of the package substrates. The solder joints may couple the first component to the package substrate and complete the mounting of the first component to the package substrate. The package assembly produced in stage 620 may include a hermetic cavity located between the first component and the package substrate, and within the guard rings of the first component and the package substrate. In particular, the first component, the hermetic region, the guard ring of the first component, the guard ring of the package substrate, and the solder joint formed between the guard rings may include hermetic materials and may hermetically seal the hermetic cavity.

In some embodiments, the mounting of the first component, of stage 620, may be performed in a controlled environment. In particular, the controlled environment may have a vacuum, humidity level, a chemical or chemicals, or some combination thereof, maintained throughout stage 620. For example, the mounting of the first component may be performed in a chamber that controls a vacuum, a humidity level, a gas or gases, a liquid or liquids, or some combination thereof, within the chamber. Once the first component is mounted to the package substrate, the hermetic cavity may maintain the vacuum, humidity level, gas or gases, liquid or liquids, or combination thereof, within the hermetic cavity even after being removed from the chamber. In some of these embodiments, the solder joints may be formed without the utilization of flux due to the environment in which the mounting of the first component is performed.

Figure 15:
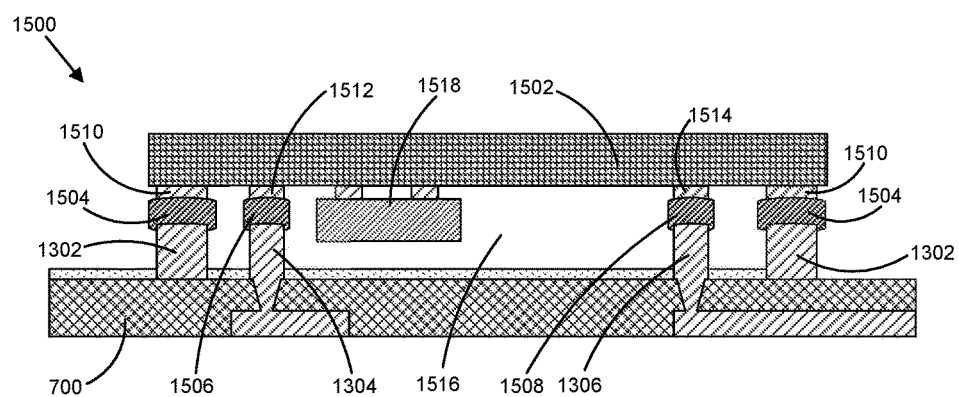
FIG. 15 illustrates an example resultant package assembly in accordance with stage 620 of the procedure of FIGS. 6A and 6B.

FIG. 15 illustrates an example resultant package assembly 1500 in accordance with stage 620. The package assembly 1500 may include a first component 1502. The first component 1502 may include one or more of the features of the first component 122 (FIG. 1). The package assembly 1500 may further include a first solder joint 1504 located between a guard ring 1510 of the first component 1502 and the guard ring 1302 of the package substrate 700. The first solder joint 1504 may have been formed by a reflow procedure having been applied to the first solder region 1308 (FIG. 13). The first solder joint 1504 may couple the guard ring 1510 to the guard ring 1302. The package assembly 1500 may further include a second solder joint 1506, located between a first contact 1512 of the first component 1502 and the first interconnect element 1304, and a third solder joint 1508, located between a second contact 1514 of the first component 1502 and the second interconnect element 1306. The second solder joint 1506 and the third solder joint 1508 may have been formed by a reflow procedure having been applied to the second solder region 1310 (FIG. 13) and the third solder region 1312 (FIG. 13), respectively. The second solder joint 1506 may couple the first contact 1512 and the first interconnect element 1304, and the third solder joint 1508 may couple the second contact 1514 and the second interconnect element 1306.

The package assembly 1500 may further include a hermetic cavity 1516. The hermetic cavity 1516 may be located between the first component 1502 and the package substrate 700, and may be within the guard ring 1302 and the guard ring 1510. The hermetic cavity 1516 may include one or more of the features of the hermetic cavity 102 (FIG. 1). The package assembly 1500 may further include a second component 1518 located within the hermetic cavity 1516 and coupled to the first component 1502. The second component 1518 may include one or more of the features of the second component 134 (FIG. 1).

In stage 622, a buildup film may be laminated to the package assembly. The buildup film may be an organic buildup film. The buildup film may be laminated to the exposed portions of the surface of the package substrate and the first component. Laminating the buildup film to the package assembly may produce a second package substrate on the package assembly. In some embodiments, stage 622 may be omitted.

Figure 16:
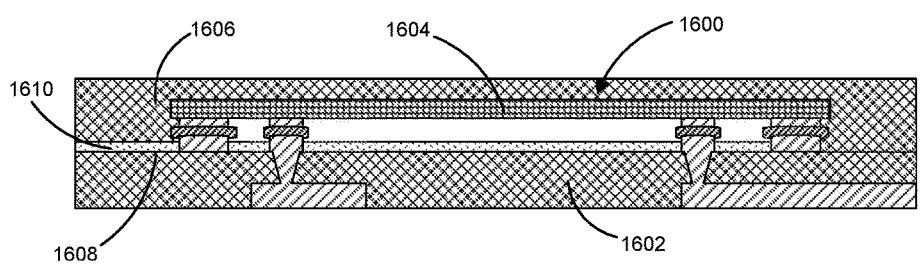
FIG. 16 illustrates a cross-sectional view of an example resultant package assembly in accordance with stage 622 of the procedure of FIGS. 6A and 6B.

FIG. 16 illustrates a cross-sectional view of an example resultant package assembly 1600 in accordance with stage 622. The package assembly 1600 may include one or more of the features of the package assembly 100 (FIG. 1). The package assembly 1600 may include a package substrate 1602 and a first component 1604 mounted to the package substrate 1602 in accordance with stage 620. The package substrate 1602 may include one or more of the features of the package substrate 104 (FIG. 1). Further, the first component 1604 may include one or more of the features of the first component 122 (FIG. 1). A buildup film 1606 may be located on a surface 1608 of the package substrate 1602 and/or a hermetic region 1610, the hermetic region 1610 being located on a portion of the surface 1608. The buildup film 1606 may include one or more layers of buildup film. A portion of the buildup film 1606 above the first component 1604 may form a second package substrate on the first component 1604.

In stage 624, an overmold may be applied to the package assembly. The overmold may include one or more of the features of the overmold 402 (FIG. 4). The overmold may be applied to the exposed portions of the surface of the package substrate and the first component. FIG. 4 may illustrate a resultant package assembly in accordance with stage 624. In some embodiments, stage 624 may be omitted.

Figure 17:
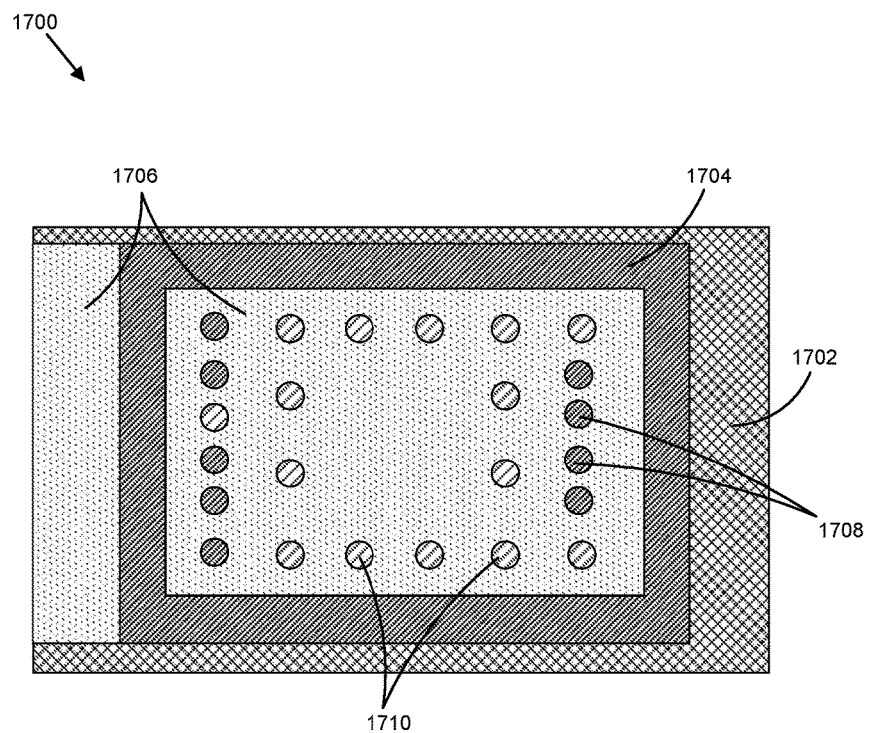
FIG. 17 illustrates a top view representation of another example package substrate, according to various embodiments.

FIG. 17 illustrates a top view representation 1700 of another example package substrate, according to various embodiments. The package substrate represented in FIG. 17 may include one or more of the features of the package substrate 104 (FIG. 1). Further, a package assembly that implements the package substrate represented in FIG. 17 may include one or more of the features of the package assembly 100 (FIG. 1). The package assembly represented in FIG. 17 may further include one or more stability pillars that extend from the package substrate. The stability pillars may include the same features as the interconnect elements 118 (FIG. 1), with the exceptions that the stability pillars may be utilized for mechanical support and may not provide electrical connectivity. Accordingly, the stability pillars may include non-conductive material in some embodiments. The stability pillars may provide mechanical stability for a component (such as the first component 122 (FIG. 1)) mounted to the package substrate, which may prevent damage or cracking of the component due to pressure applied to the component, which may occur during application of buildup film or overmold.

The representation 1700 represents locations where features may be located on and/or extend from the package substrate represented in FIG. 17. The representation 1700 illustrates the package substrate from a top view of the package substrate with different shading and/or patterns indicating portions of the package substrate where the features are located on and/or extend from the package substrate, as described below.

The representation 1700 may include a first portion 1702 of the package substrate. The first portion 1702 may not have any features described in relation to FIG. 1 nor stability pillars located on and/or extending from a surface (such as the surface 116 (FIG. 1)) of the package substrate.

The representation 1700 may further include a second portion 1704 of the package substrate. The second portion 1704 indicates where a guard ring (such as the guard ring 114 (FIG. 1)) may extend from the package substrate. In the illustrated embodiment, the second portion 1704 is illustrated as a rectangle. However, it is to be understood that the second portion 1704 may be the same shape as any of the shapes of which the guard ring 114 (FIG. 1) may be, as described in relation to FIG. 1, in other embodiments.

The representation 1700 may further include a third portion 1706 of the package substrate. The third portion 1706 indicates where a hermetic region (such as the hermetic region 120 (FIG. 1)) may be located on the package substrate. In the illustrated embodiment, the hermetic region is located within the guard ring (as represented by the second portion 1704) and outside of the guard ring. In other embodiments, the hermetic region may be located only within the guard ring.

The representation 1700 may further include a fourth portion 1708 of the package substrate. In particular, the fourth portion 1708 is indicated by the dark grey circles within the third portion 1706. The fourth portion 1708 indicates where interconnect elements (such as the interconnect elements 118 (FIG. 1)) may extend from the package substrate. In the illustrated embodiment, the interconnect elements are located only within the guard ring. In other embodiments, the interconnect elements may be located outside of the guard ring, may be located within the guard ring, may be implemented into the guard ring, or some combination thereof.

The representation 1700 may further include a fifth portion 1710 of the package substrate. In particular, the fifth portion 1710 is indicated by the light grey circles within the third portion 1706. The fifth portion 1710 indicates where stability pillars may extend from the package substrate. In the illustrated embodiment, the stability pillars are located only within the guard ring. In other embodiments, the stability pillars may be located outside of the guard ring, may be located within the guard ring, or some combination thereof.

Figure 18:
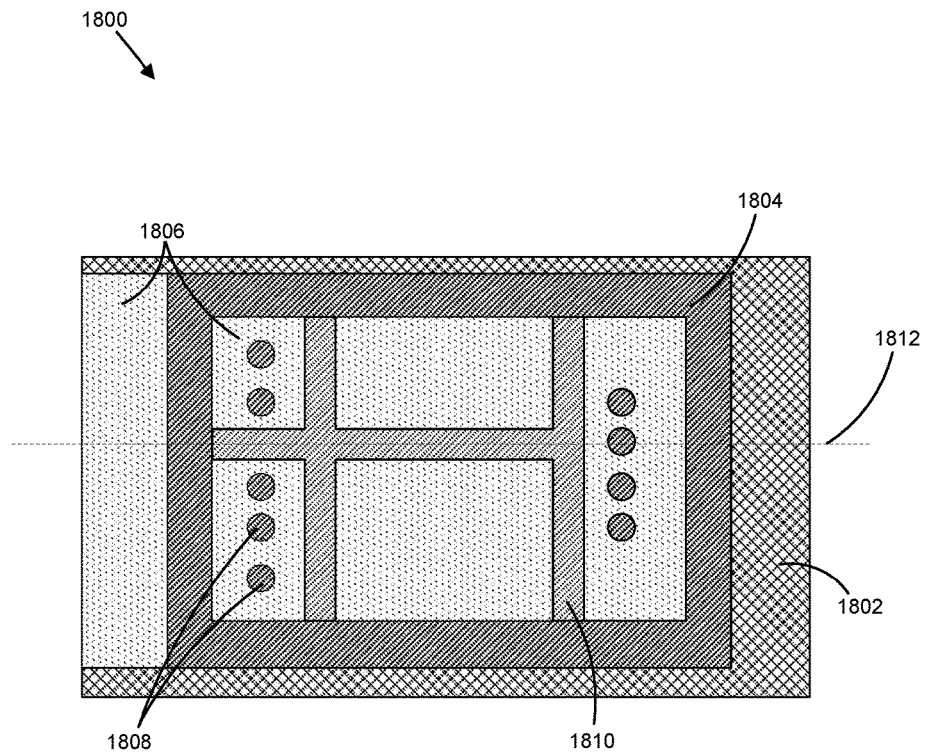
FIG. 18 illustrates a top view representation of another example package substrate, according to various embodiments.

FIG. 18 illustrates a top view representation 1800 of another example package substrate, according to various embodiments. The package substrate represented in FIG. 18 may include one or more of the features of the package substrate 104 (FIG. 1). Further, a package assembly that implements the package substrate represented in FIG. 18 may include one or more of the features of the package assembly 100 (FIG. 1). The package assembly represented in FIG. 18 may further include one or more stability beams that extend from the package substrate. The stability beams may include one or more of the stability pillars described in relation to FIG. 17. The stability beams may include non-conductive material in some embodiments. The stability beams may provide mechanical stability for a component (such as the first component 122 (FIG. 1)) mounted to the package substrate, which may prevent damage or cracking of the component due to pressure applied to the component, which may occur during application of buildup film or overmold.

The representation 1800 represents locations where features may be located on and/or extend from the package substrate represented in FIG. 18. The representation 1800 illustrates the package substrate from a top view of the package substrate with different shading and/or patterns indicating portions of the package substrate where the features are located on and/or extend from the package substrate, as described below.

The representation 1800 may include a first portion 1802 of the package substrate. The first portion 1802 may not have any features described in relation to FIG. 1 nor stability beams located on and/or extending from a surface (such as the surface 116 (FIG. 1)) of the package substrate.

The representation 1800 may further include a second portion 1804 of the package substrate. The second portion 1804 indicates where a guard ring (such as the guard ring 114 (FIG. 1)) may extend from the package substrate. In the illustrated embodiment, the second portion 1804 is illustrated as a rectangle. However, it is to be understood that the second portion 1804 may be the same shape as any of the shapes of which the guard ring 114 (FIG. 1) may be, as described in relation to FIG. 1, in other embodiments.

The representation 1800 may further include a third portion 1806 of the package substrate. The third portion 1806 indicates where a hermetic region (such as the hermetic region 120 (FIG. 1)) may be located on the package substrate. In the illustrated embodiment, the hermetic region is located within the guard ring (as represented by the second portion 1804) and outside of the guard ring. In other embodiments, the hermetic region may be located only within the guard ring.

The representation 1800 may further include a fourth portion 1808 of the package substrate. In particular, the fourth portion 1808 is indicated by the dark grey circles within the third portion 1806. The fourth portion 1808 indicates where interconnect elements (such as the interconnect elements 118 (FIG. 1)) may extend from the package substrate. In the illustrated embodiment, the interconnect elements are located only within the guard ring. In other embodiments, the interconnect elements may be located outside of the guard ring, may be located within the guard ring, may be implemented into the guard ring, or some combination thereof.

The representation 1800 may further include a fifth portion 1810 of the package substrate. In particular, the fifth portion 1810 is indicated by the light grey lines within the third portion 1806. The fifth portion 1810 indicates where stability beams may extend from the package substrate. In the illustrated embodiment, the stability beams are located only within the guard ring. In other embodiments, the stability beams may be located outside of the guard ring, may be located within the guard ring, or some combination thereof.

The representation 1800 further includes a cross-section line 1812. The cross-section line 1812 is used to illustrate the cross-section of the package substrate illustrated by FIG. 19.

Figure 19:
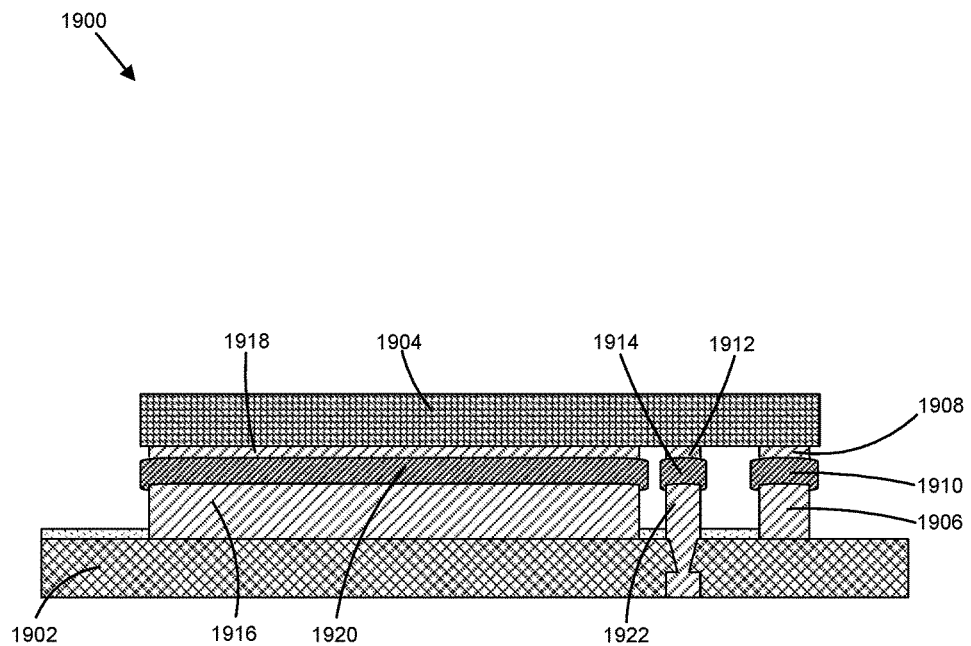
FIG. 19 illustrates a cross-sectional view of an example package assembly associated with the representation of the package substrate illustrated in FIG. 18, according to various embodiments.

FIG. 19 illustrates a cross-sectional view of an example package assembly 1900 associated with the representation 1800 of the package substrate illustrated in FIG. 18, according to various embodiments. In particular, FIG. 19 illustrates a cross-sectional view of the package assembly 1900 along the cross-section line 1812 shown in FIG. 18.

The package assembly 1900 may include a package substrate 1902 and a component 1904 mounted to the package substrate 1902. The package substrate 1902 may include one or more of the features of the package substrate 104 (FIG. 1). The component 1904 may include one or more of the features of the first component 122 (FIG. 1). Further, the component 1904 may be mounted to the package substrate 1902 similarly to how the first component 122 is mounted to the package substrate 104.

The package substrate 1902 may include a guard ring 1906. The guard ring 1906 may include one or more of the features of the guard ring 114 (FIG. 1). The component 1904 may include a guard ring 1908. The guard ring 1908 may include one or more of the features of the guard ring 124 (FIG. 1). The guard ring 1908 of the component 1904 may align with the guard ring 1906 of the package substrate 1902. The guard ring 1908 may be coupled to the guard ring 1906 by a solder joint 1910. The solder joint 1910 may include one or more of the features of the solder joint 130 (FIG. 1).

The package substrate 1902 may further include one or more interconnect elements 1922. The interconnect elements 1922 may include one or more of the features of the interconnect elements 118 (FIG. 1). The component 1904 may include one or more contacts 1912. The contacts 1912 may include one or more of the features of the contacts 128 (FIG. 1). Each contact of the contacts 1912 may align with a corresponding interconnect element of the interconnect elements 1922. Each contact of the contacts 1912 may be coupled to the corresponding interconnect element of the interconnect elements 1922 by a corresponding solder joint of solder joints 1914. The solder joints 1914 may include one or more of the features of the solder joints 132 (FIG. 1).

The package substrate 1902 may further include one or more stability beams 1916. The stability beams 1916 may extend from the package substrate 1902 into an area located between the package substrate 1902 and the component 1904. The stability beams 1916 may extend perpendicularly to the package substrate 1902, at an angle to the package substrate 1902, or some combination thereof. The stability beams 1916 may provide mechanical stability for the component 1904 and may prevent damage or cracking of the component 1904 due to pressure applied to the component 1904, which may occur during application of buildup film or overmold.

The stability beams 1916 may include non-conductive material, conductive material, or some combination thereof. Further, the stability beams 1916 may be formed of a hermetic material, such as copper, nickel, palladium, gold, indium, tin, or some combination thereof. The stability beams 1916 may provide some hermeticity to a hermetic cavity (such as the hermetic cavity 102 (FIG. 1)) of the package assembly 1900, preventing elements from passing through the stability beams 1916 into and out of the hermetic cavity.

The component 1904 may further include one or more stability beams 1918. The stability beams 1918 may include one or more of the features of the stability beams 1916. The stability beams 1918 may extend from the component 1904 into an area located between the package substrate 1902 and the component 1904. The stability beams 1918 may extend perpendicularly to the component 1904, at an angle to the component 1904, or some combination thereof. The stability beams 1918 may provide mechanical stability for the component 1904 and may prevent damage or cracking of the component 1904 due to pressure applied to the component 1904, which may occur during application of buildup film or overmold.

The stability beams 1918 of the component 1904 may align with the stability beams 1916 of the package substrate 1902. In particular, an end of the stability beams 1918 opposite from the component 1904 may align with an end of the stability beams 1916 opposite from the package substrate 1902. The stability beams 1918 may be coupled to the stability beams 1916 by solder joints 1920. The solder joints 1920 may include one or more of the features of the solder joint 1910.

Figure 20:
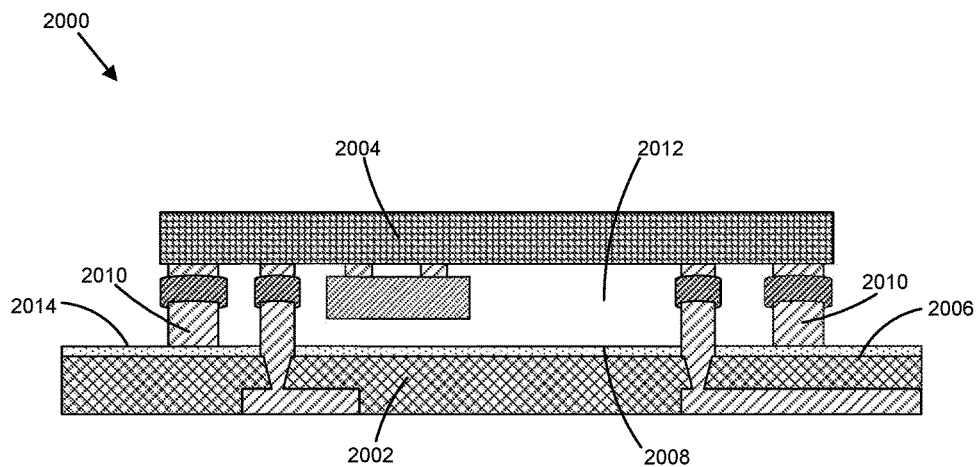
FIG. 20 illustrates a cross-sectional view of another example package assembly, according to various embodiments.

FIG. 20 illustrates a cross-sectional view of another example package assembly 2000, according to various embodiments. The package assembly 2000 may include one or more of the features of the package assembly 100 (FIG. 1). In particular, the package assembly 2000 may include a package substrate 2002 and a component 2004 mounted to the package substrate 2002. A hermetic cavity 2012 may be located between the package substrate 2002 and the component 2004. The package substrate 2002 may include one or more of the features of the package substrate 104 (FIG. 1). The component 2004 may include one or more of the features of the first component 122 (FIG. 1). Further, the hermetic cavity 2012 may include one or more of the features of the hermetic cavity 102 (FIG. 1).

The package assembly 2000 may include a hermetic region 2008 located on a surface 2006 of the package substrate 2002. The hermetic region 2008 may include one or more of the features of the hermetic region 120 (FIG. 1). The package assembly 2000 may further include a guard ring 2010. The guard ring 2010 may include one or more of the features of the guard ring 114 (FIG. 1). Unlike the guard ring 114, the guard ring 2010 may be located on the hermetic region 2008. In particular, the guard ring 2010 may be located on a surface 2014 of the hermetic region 2008 opposite from package substrate 2002.

A procedure for production of the package assembly 2000 may be similar to the procedure 600 (FIG. 6). A difference in the procedure for production of the package assembly 2000 from the procedure 600 may be that the first aperture 904 (FIG. 9) and the fourth aperture 910 (FIG. 9) may be omitted from the resist 902 (FIG. 9). Accordingly, portions of the hermetic region 2008 corresponding to the guard ring 2010 may not be removed, such as is performed in stage 608 (FIG. 6) of the procedure 600. Therefore, when the guard ring 2010 is formed during a metal plating procedure (such as performed in stage 616 (FIG. 6)), the guard ring 2010 may be formed on the surface 2014 of the hermetic region 2008.

Figure 21:
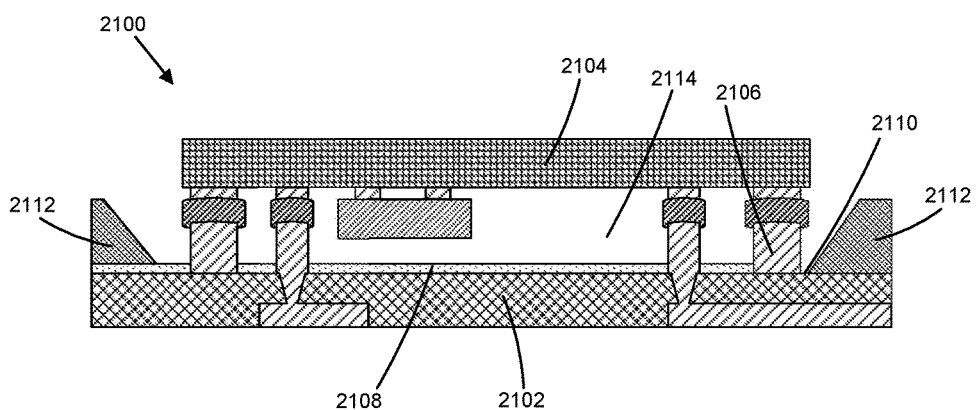
FIG. 21 illustrates a cross-sectional view of another example package assembly, according to various embodiments.

FIG. 21 illustrates a cross-sectional view of another example package assembly 2100, according to various embodiments. The package assembly 2100 may include one or more of the features of the package assembly 100 (FIG. 1). In particular, the package assembly 2100 may include a package substrate 2102 and a component 2104 mounted to the package substrate 2102. A hermetic cavity 2114 may be located between the package substrate 2102 and the component 2104. The package substrate 2102 may include one or more of the features of the package substrate 104 (FIG. 1). The component 2104 may include one or more of the features of the first component 122. Further, the hermetic cavity 2114 may include one or more of the features of the hermetic cavity 102 (FIG. 1).

The package assembly 2100 may further include a guard ring 2106 and a hermetic region 2108 located on a surface 2110 of the package substrate 2102. The guard ring 2106 may include one or more of the features of the guard ring 114 (FIG. 1). The hermetic region 2108 may include one or more of the features of the hermetic region 120 (FIG. 1).

The package assembly 2100 may further include a solder resist 2112. The solder resist 2112 may be located on the surface 2110 of the package substrate 2102, on the hermetic region 2108, or some combination thereof. Further, the solder resist 2112 may be located outside of the guard ring 2106 and may encircle the guard ring 2106. The solder resist 2112 may cover the rest of the surface 2110 and/or the hermetic region 2108 located outside of the guard ring 2106. Accordingly, since the solder resist 2112 may be located on the surface 2110 and/or the hermetic region 2108, the legacy process of record top layer configuration of package substrates may be preserved by the package assembly 2100.

Figure 22:
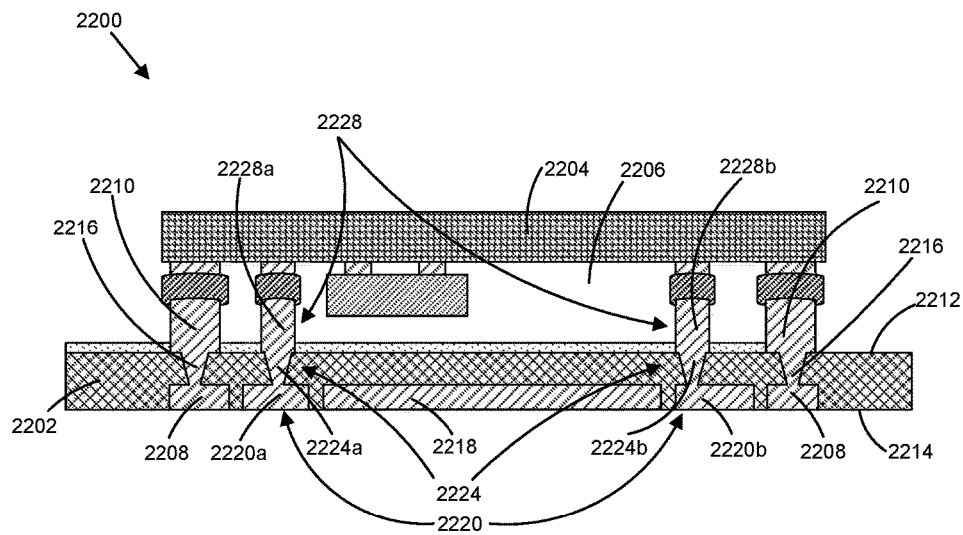
FIG. 22 illustrates a cross-sectional view of another example package assembly, according to various embodiments.

FIG. 22 illustrates a cross-sectional view of another example package assembly 2200, according to various embodiments. The package assembly 2200 may be utilized in instances where a component (such as component 2204) within the package assembly 2200 is an RF component or an RF system. The package assembly 2200 may include a hermetic cavity (such hermetic cavity 2206) that provides a stable RF cavity (resonator) structure for the RF component or RF structure.

The package assembly 2200 may include one or more of the features of the package assembly 100 (FIG. 1). In particular, the package assembly 2200 may include a package substrate 2202 with a component 2204 mounted to the package substrate 2202. A hermetic cavity 2206 may be located between the package substrate 2202 and the component 2204. The package substrate 2202 may include one or more of the features of the package substrate 104 (FIG. 1). The component 2204 may include one or more of the features of the first component 122 (FIG. 1). Further, the hermetic cavity 2206 may include one or more of the features of the hermetic cavity 102 (FIG. 1).

The package substrate 2202 may include a guard ring 2210. The guard ring 2210 may include one or more of the features of the guard ring 114 (FIG. 1). The guard ring 2210 may extend from a first surface 2212 of the package substrate 2202. The package substrate 2202 may further include a metal ring 2208. The metal ring 2208 may be located at a second surface 2214 of the package substrate 2202, wherein the second surface 2214 is located on an opposite side of the package substrate 2202 from the first surface 2212. The metal ring 2208 may align with the guard ring 2210 and may extend along the second surface 2214 for an entirety of the area where the guard ring 2210 extends from the first surface 2212. The metal ring 2208 may include copper, nickel, palladium, gold, indium, tin, or some combination thereof.

The package substrate 2202 may further include a trench 2216. The trench 2216 may be located between the guard ring 2210 and the metal ring 2208, and may couple the guard ring 2210 to the metal ring 2208. The trench 2216 may extend for the entirety of the area where the guard ring 2210 extends from the first surface 2212 and an entirety of the metal ring 2208.

The package substrate 2202 may further include one or more traces 2220, one or more vias 2224 coupled to the traces 2220, and one or more interconnect elements 2228. In the illustrated embodiment, the traces 2220 may include a first trace 2220a and a second trace 2220b, the vias 2224 may include a first via 2224a and a second via 2224b, and the interconnect elements 2228 may include a first interconnect element 2228a and a second interconnect element 2228b. The traces 2220 may include one or more of the features of the first trace 106 (FIG. 1) and/or the second trace 108 (FIG. 1). The vias 2224 may include one or more of the features of the first via 110 (FIG. 1) and/or the second via 112 (FIG. 1). The interconnect elements 2228 may include one or more of the features of the interconnect elements 118 (FIG. 1).

The package substrate 2202 may further include a metal plate 2218. The metal plate 2218 may be located at the second surface 2214 and may be within an area defined by the guard ring 2210. The metal plate 2218 may further avoid contact with the traces 2220 and the vias 2224. For example, in the illustrated embodiment, the metal plate 2218 may be located between the first trace 2220a and the second trace 2220b. The metal plate 2218 may further include one or more openings (such as the openings represented by the fifth portion 2410 (FIG. 24)). The openings may provide for signal feed through.

Figure 23:
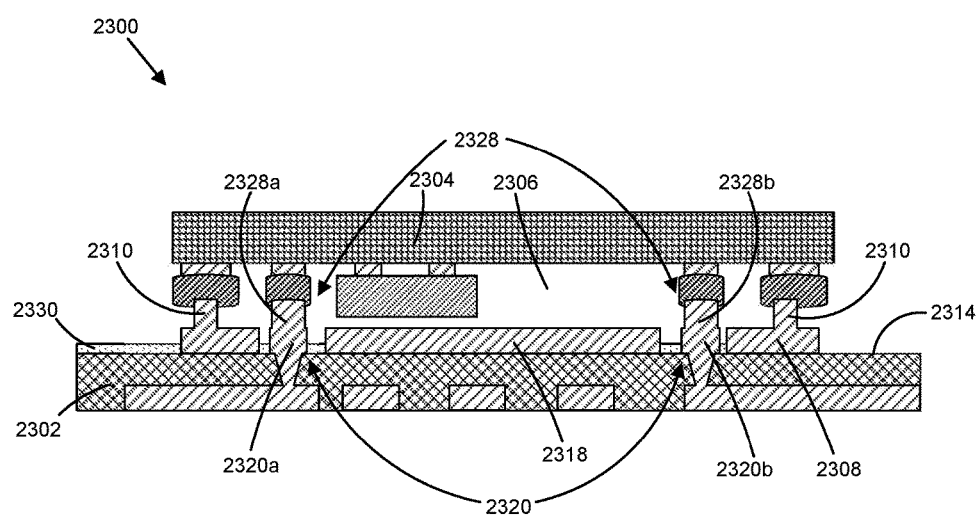
FIG. 23 illustrates a cross-sectional view of another example package assembly, according to various embodiments.

FIG. 23 illustrates a cross-sectional view of another example package assembly 2300, according to various embodiments. The package assembly 2300 may be utilized in instances where a component (such as component 2304) within the package assembly 2300 is an RF component or an RF system. The package assembly 2300 may include a hermetic cavity (such hermetic cavity 2306) that provides a stable RF cavity (resonator) structure for the RF component or RF structure.

The package assembly 2300 may include one or more of the features of the package assembly 100 (FIG. 1). In particular, the package assembly 2300 may include a package substrate 2302 with a component 2304 mounted to the package substrate 2302. A hermetic cavity 2306 may be located between the package substrate 2302 and the component 2304. The package substrate 2302 may include one or more of the features of the package substrate 104 (FIG. 1). The component 2304 may include one or more of the features of the first component 122 (FIG. 1). Further, the hermetic cavity 2306 may include one or more of the features of the hermetic cavity 102 (FIG. 1).

The package substrate 2302 may include a guard ring 2310. The guard ring 2310 may include one or more of the features of the guard ring 114 (FIG. 1). The package substrate may further include a metal ring 2308. The metal ring 2308 may be located on a surface 2314 of the package substrate 2302. The metal ring 2308 may align with the guard ring 2310 and may extend along the surface 2314 for an entirety of the the guard ring 2310. The guard ring 2310 may extend from the metal ring 2208 in a direction opposite to the package substrate 2302. The guard ring 2310 may extend from the metal ring 2308 perpendicularly to the surface 2314 of the package substrate 2302, at an angle to the surface 2314 of the package substrate 2302, or some combination thereof. The metal ring 2308 may include copper, nickel, palladium, gold, indium, tin, or some combination thereof.

The package substrate 2302 may further include one or more traces 2320, and one or more interconnect elements 2328. The traces 2320 may be located on the surface 2314 of the package substrate 2302. The interconnect elements 2328 may extend from the traces 2320 in a direction opposite to the package substrate 2302. The interconnect elements 2328 may extend from the traces 2320 perpendicularly to the surface 2314 of the package substrate 2302, at an angle to the surface 2314 of the package substrate 2302, or some combination thereof. In the illustrated embodiment, the traces 2320 may include a first trace 2320a and a second trace 2320b, and the interconnect elements 2328 may include a first interconnect element 2328a and a second interconnect element 2328b. The traces 2320 may include one or more of the features of the first trace 106 (FIG. 1) and/or the second trace 108 (FIG. 1). The interconnect elements 2328 may include one or more of the features of the interconnect elements 118 (FIG. 1).

The package substrate 2302 may further include a metal plate 2318. The metal plate 2318 may be located on the surface 2314 and may be within an area defined by the guard ring 2310. The metal plate 2318 may further avoid contact with the traces 2320. For example, in the illustrated embodiment, the metal plate 2318 may be located between the first trace 2320a and the second trace 2320b. The metal plate 2318 may further include one or more openings (such as the openings represented by the fifth portion 2410 (FIG. 24)). The openings may provide for signal feed through. In some embodiments, the openings may be filled by a portion of a hermetic region 2330, the hermetic region 2330 being located on the surface 2314 of the package substrate 2302. In other embodiments, the metal plate 2318 may be located on the hermetic region 2330 and the openings may be located above the hermetic region 2330.

Figure 24:
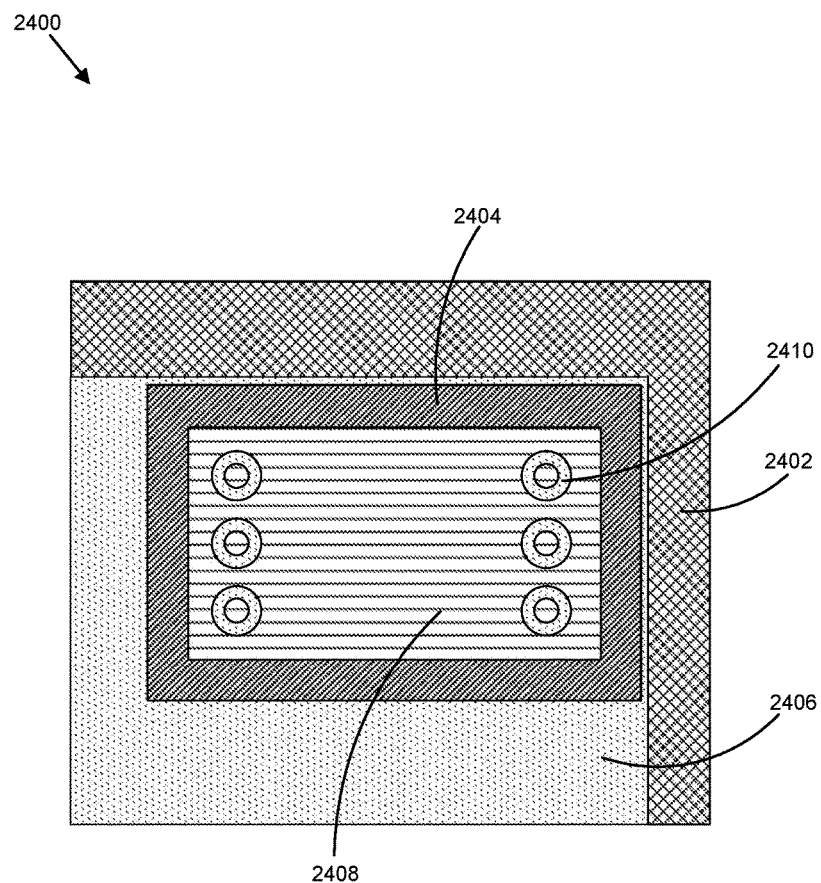
FIG. 24 illustrates a top view representation of an example package substrate with a metal plate, according to various embodiments.

FIG. 24 illustrates a top view representation 2400 of an example package substrate with a metal plate, according to various embodiments. The package substrate may include one or more of the features of the package substrate 104 (FIG. 1). The metal plate may include one or more of the features of the metal plate 2218 (FIG. 22) and/or the metal plate 2318 (FIG. 23). Further, a package assembly that implements the package substrate represented in FIG. 24 may include one or more of the features of the package assembly 100 (FIG. 1).

The representation 2400 represents locations where features may be located on and/or extend from the package substrate represented in FIG. 24. The representation 2400 illustrates the package substrate from a top view of the package substrate with different shading and/or patterns indicating portions of the package substrate where the features are located on and/or extend from the package substrate, as described below.

The representation 2400 may include a first portion 2402 of the package substrate. The first portion 2402 may not have any features described in relation to FIG. 1 or the metal plate located on and/or extending from a surface (such as the surface 116 (FIG. 1)) of the package substrate.

The representation 2400 may further include a second portion 2404 of the package substrate. The second portion 2404 indicates where a guard ring (such as the guard ring 114 (FIG. 1)) may extend from the package substrate. In the illustrated embodiment, the second portion 2404 is illustrated as a rectangle. However, it is to be understood that the second portion 2404 may be the same shape as any of the shapes of which the guard ring 114 (FIG. 1) may be, as described in relation to FIG. 1, in other embodiments.

The representation 2400 may further include a third portion 2406 of the package substrate. The third portion 2406 indicates where a hermetic region (such as the hermetic region 120 (FIG. 1)) may be located on the package substrate. In the illustrated embodiment, the hermetic region is located within the guard ring (as represented by the second portion 2404) and outside of the guard ring. In other embodiments, the hermetic region may be located only within the guard ring.

The representation 2400 may further include a fourth portion 2408 of the package substrate. The fourth portion 2408 indicates where a metal plate (such as the metal plate 2318 (FIG. 23)) may be located on the package substrate. In the illustrated embodiment, the metal plate extends across an entirety of the area within the guard ring. In other embodiments, the metal plate may extend across a portion of the area within the guard ring.

The representation 2400 may further include a fifth portion 2410 of the package substrate located within the fourth portion 2408. In particular, the fifth portion 2410 is indicated by the circles within the fourth portion 2408. The fifth portion 2410 indicates where one or more openings may be located within the metal plate. In the illustrated embodiment, the openings may be filled with and/or located above a portion of the hermetic region.

Figure 25:
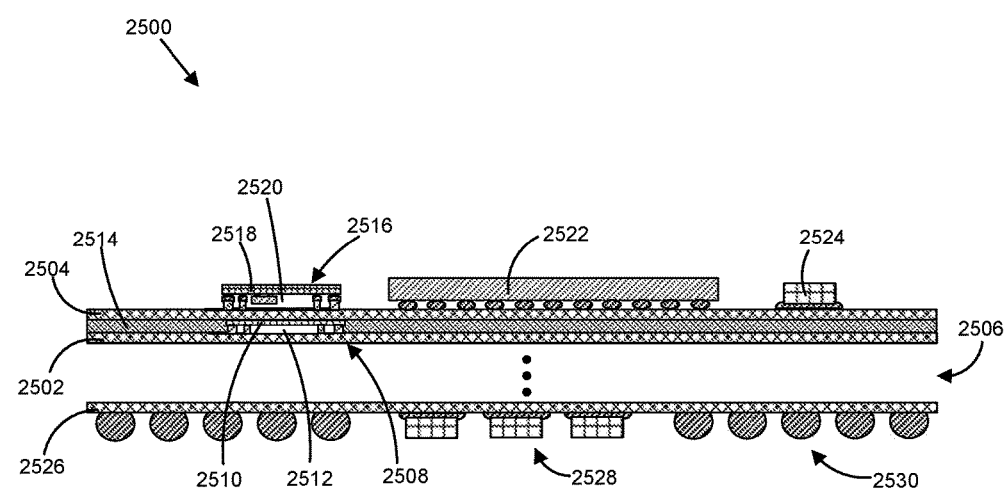
FIG. 25 illustrates a cross-sectional view of an example substrate package including a package assembly with hermetic cavity, according to various embodiments.

FIG. 25 illustrates a cross-sectional view of an example package substrate 2500 including a package assembly with hermetic cavity, according to various embodiments. In particular, the package substrate 2500 may include multiple package layers 2506 located in a buildup arrangement. Each package substrate of the multiple package layers 2506 may include one or more of the features of the package substrate 104 (FIG. 1). The multiple package layers 2506 may be generated by producing multiple package layers on a package layer by the buildup film lamination procedure of stage 622 (FIG. 6). In particular, the illustrated embodiment illustrates a first package layer 2502 and a second package layer 2504 located on buildup films 2514 located on the first package layer 2502. The second package layer 2504 may have been produced on the first package layer 2502 by applying the buildup film lamination procedure of stage 622 to the first package layer 2502.

The package substrate 2500 may include a first package assembly 2508. The first package assembly 2508 may include one or more of the features of the package assembly 100 (FIG. 1). The first package assembly 2508 may include a portion of the first package layer 2502 on which a first component 2510 is mounted. A first hermetic cavity 2512 may be located between the first package layer 2502 and the first component 2510. The first component 2510 may include one or more of the features of the first component 122 (FIG. 1). Further, the first hermetic cavity 2512 may include one or more of the features of the hermetic cavity 102 (FIG. 1).

One or more buildup films 2514 (such as the buildup film 1606 (FIG. 16)) may be located on the first package layer 2502 and/or the first component 2510. The buildup films 2514 may fill the area between the first package layer 2502 and the second package layer 2504, and/or may generate the second package layer 2504.

The package substrate 2500 may further include a second package assembly 2516. The second package assembly 2516 may include one or more of the features of the package assembly 100. The second package assembly 2516 may include a portion of the second package layer 2504 on which a second component 2518 is mounted. A second hermetic cavity 2520 may be located between the second package layer 2504 and the second component 2518. The second component 2518 may include one or more of the features of the first component 122. Further, the second hermetic cavity 2520 may include one or more of the features of the hermetic cavity 102.

Additional components may be located and/or mounted to the first package layer 2502, the second package layer 2504, other package layers within the package layers 2506, or some combination thereof. In the illustrated embodiment, the second package layer 2504 may be a top package substrate within the package layers 2506. A processor 2522 and a passive component 2524 may be located on the second package layer 2504. In particular, the processor 2522 and the passive component 2524 may be located on the second package layer 2504 adjacent to the second package assembly 2516.

The package substrate 2500 may further include a third package layer 2526 within the package layers 2506. The third package layer 2526 may be a bottom package layer within the package layers 2506, wherein the bottom package layer is opposite to the top package layer within the package layers 2506. One or more passive components 2528 and interconnects 2530 may be located on third package layer 2526. In particular, the passive components 2528 and the interconnects 2530 may be located on a surface of the third package layer 2526 opposite from the second package layer 2504. The interconnects 2530 may be utilized for mounting the package substrate 2500 to a printed circuit board (PCB) (such as the PCB 2602 (FIG. 26)).

Figure 26:
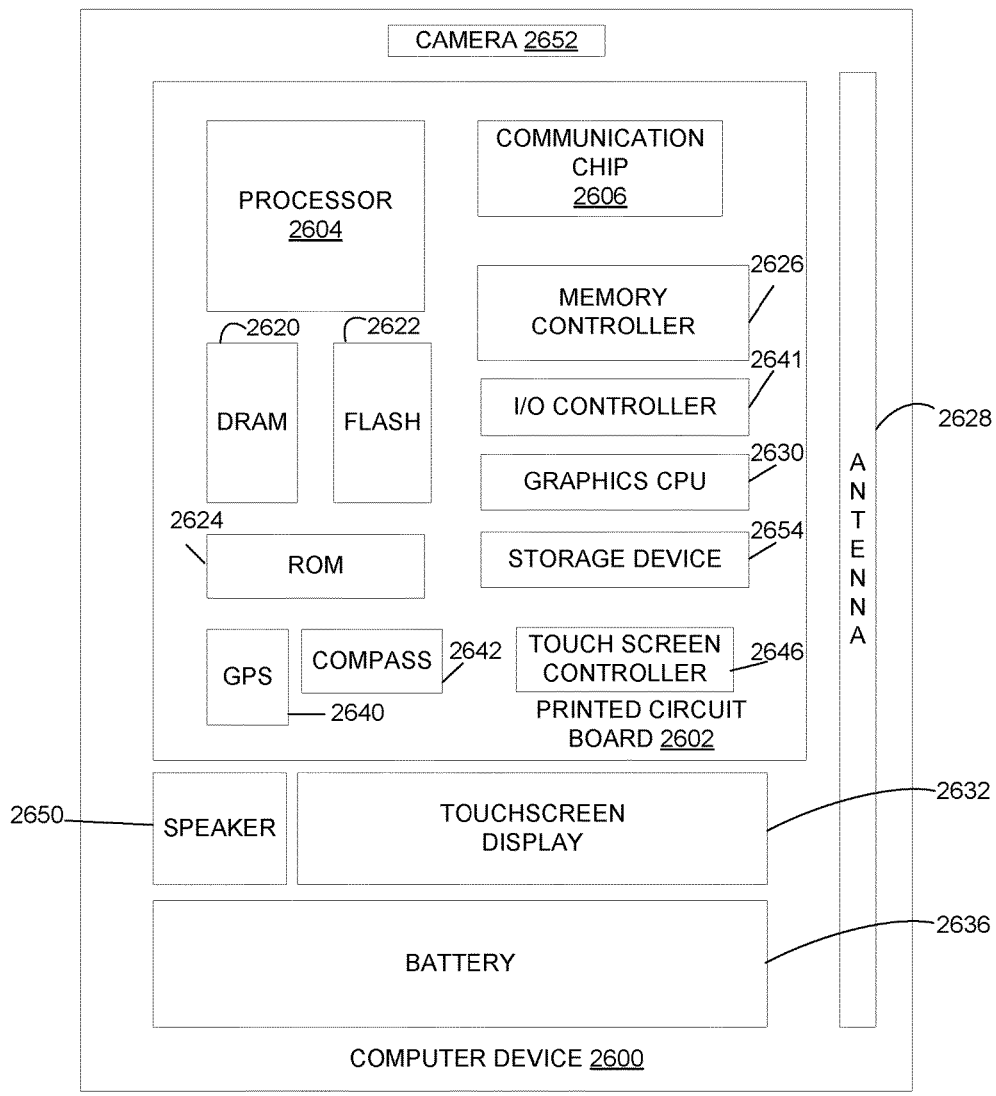
FIG. 26 illustrates an example computer device that may employ the apparatuses and/or methods described herein.

FIG. 26 illustrates an example computer device 2600 that may employ the apparatuses and/or methods described herein (e.g., the package assembly 100, the package assembly 100 with overmold 402, the procedure 600, the package assembly corresponding to the representation 1700, the package assembly corresponding to the representation 1800, the package assembly 1900, the package assembly 2000, the package assembly 2100, the package assembly 2200, the package assembly 2300, the package assembly corresponding to the representation 2400, and/or the system 2500), in accordance with various embodiments. As shown, computer device 2600 may include a number of components, such as one or more processor(s) 2604 (one shown) and at least one communication chip 2606. In various embodiments, the one or more processor(s) 2604 each may include one or more processor cores. In various embodiments, the at least one communication chip 2606 may be physically and electrically coupled to the one or more processor(s) 2604. In further implementations, the communication chip 2606 may be part of the one or more processor(s) 2604. In various embodiments, computer device 2600 may include printed circuit board (PCB) 2602. For these embodiments, the one or more processor(s) 2604 and communication chip 2606 may be disposed thereon. In alternate embodiments, the various components may be coupled without the employment of PCB 2602.

Depending on its applications, computer device 2600 may include other components that may or may not be physically and electrically coupled to the PCB 2602. These other components include, but are not limited to, memory controller 2626, volatile memory (e.g., dynamic random access memory (DRAM) 2620), non-volatile memory such as read only memory (ROM) 2624, flash memory 2622, storage device 2654 (e.g., a hard-disk drive (HDD)), an I/O controller 2641, a digital signal processor (not shown), a crypto processor (not shown), a graphics processor 2630, one or more antenna 2628, a display (not shown), a touch screen display 2632, a touch screen controller 2646, a battery 2636, an audio codec (not shown), a video codec (not shown), a global positioning system (GPS) device 2640, a compass 2642, an accelerometer (not shown), a gyroscope (not shown), a speaker 2650, a camera 2652, and a mass storage device (such as hard disk drive, a solid state drive, compact disk (CD), digital versatile disk (DVD)) (not shown), and so forth.

In some embodiments, the one or more processor(s) 2604, flash memory 2622, and/or storage device 2654 may include associated firmware (not shown) storing programming instructions configured to enable computer device 2600, in response to execution of the programming instructions by one or more processor(s) 2604, to practice all or selected aspects of the methods described herein. In various embodiments, these aspects may additionally or alternatively be implemented using hardware separate from the one or more processor(s) 2604, flash memory 2622, or storage device 2654.

The communication chips 2606 may enable wired and/or wireless communications for the transfer of data to and from the computer device 2600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 2606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 2600 may include a plurality of communication chips 2606. For instance, a first communication chip 2606 may be dedicated to shorter range wireless communications such as Wi-Fi and Bluetooth, and a second communication chip 2606 may be dedicated to longer range wireless communications such as GPS, EDGE, GPRS, CDMA, WiMAX, LTE, Ev-DO, and others.

One or more of the components mounted to the PCB 2602 may include package assemblies in accordance with the package assemblies disclosed herein. In particular, the processor 2604, the communication chip 2606, the DRAM 2620, the flash memory 2622, the ROM 2624, the GPS 2640, the compass 2642, the memory controller 2626, the I/O controller 2641, the graphics CPU 2630, the storage device 2654, the touch screen controller 2646, or some combination thereof, may include package assemblies in accordance with the package assembly 100, the package assembly 100 with overmold 402, the package assembly corresponding to the representation 1700, the package assembly corresponding to the representation 1800, the package assembly 1900, the package assembly 2000, the package assembly 2100, the package assembly 2200, the package assembly 2300, the package assembly corresponding to the representation 2400, or some combination thereof.

In various implementations, the computer device 2600 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 2600 may be any other electronic device that processes data.

Example 1 may include a package assembly, comprising a package substrate that includes a guard ring, wherein the guard ring extends from a surface of the package substrate and around a circumference of a cavity, and a component coupled to the guard ring by a solder joint along an entirety of the guard ring, wherein the cavity is located between the package substrate and the component and the cavity is hermetically-sealed via the guard ring and the solder joint.

Example 2 may include the package assembly of example 1, wherein the package substrate includes a dielectric material that extends within the guard ring and provides hermeticity.

Example 3 may include the package assembly of example 2, wherein the dielectric material is located on the surface of the package substrate.

Example 4 may include the package assembly of example 2, wherein the dielectric material is an inorganic dielectric material.

Example 5 may include the package assembly of example 2, wherein the dielectric material includes silicon, nitrogen, aluminum, or oxygen.

Example 6 may include the package assembly of any of examples 1-5, wherein the package substrate further includes an interconnect element located within the guard ring, wherein the interconnect element extends from the surface of the package substrate, is coupled to the component, and provides electrical connectivity between the package substrate and the component.

Example 7 may include the package assembly of any of examples 1-5, wherein the guard ring includes a first region located on the surface of the package substrate and a second region located on the first region, and wherein the first region includes copper and the second region includes solder.

Example 8 may include the package assembly of any of examples 1-5, wherein the guard ring includes a first region located on the surface of the package substrate, a second region located on the first region, and a third region located on the second region, wherein the first region includes copper, wherein the second region includes a surface finish, and wherein the third region includes solder.

Example 9 may include the package assembly of example 8, wherein the surface finish includes nickel, palladium, or gold.

Example 10 may include the package assembly of any of examples 1-5, wherein the guard ring includes a first region located on the surface of the package substrate and a second region located on the first region, and wherein the first region includes copper and the second region includes a surface finish.

Example 11 may include the package assembly of example 10, wherein the surface finish includes nickel, palladium, or gold.

Example 12 may include the package assembly of example 10, wherein the second region further is located on a first side of the first region and a second side of the first region, the second side opposite to the first side, and wherein the first side and the second side extend substantially perpendicularly from the surface of the package substrate.

Example 13 may include the package assembly of example 12, wherein the surface finish includes nickel, palladium, or gold.

Example 14 may include the package assembly of any of examples 1-5, wherein the component is a device with moving elements (DME), and wherein an element of the DME extends within the cavity.

Example 15 may include a method of producing a hermetic cavity within a package assembly, comprising forming a guard ring on a surface of a package substrate, wherein the guard ring is to extend around a circumference of the hermetic cavity, positioning a component on the guard ring, and forming a solder joint coupling the guard ring and the component, wherein the solder joint hermetically seals the hermetic cavity.

Example 16 may include the method of example 15, wherein forming the guard ring includes positioning a resist on the surface of the package substrate, the resist having an opening for the guard ring, performing a metal plating procedure that deposits the guard ring within the opening of the resist, and removing the resist.

Example 17 may include the method of example 16, wherein performing the metal plating procedure includes forming a first region on the surface of the package substrate, the first region including copper, and forming a second region on a surface of the first region, the surface of the first region being located on an opposite side of the first region from the surface of the package substrate.

Example 18 may include the method of example 17, wherein the second region includes solder, nickel, palladium, or gold.

Example 19 may include the method of example 17, wherein performing the metal plating procedure further includes forming a third region on a surface of the second region, the surface of the second region being located on an opposite side of the second region from the surface of the first region, wherein the second region includes nickel, palladium, or gold, and wherein the third region includes solder.

Example 20 may include the method of any of examples 15-19, further comprising depositing a hermetic region on the package substrate.

Example 21 may include the method of example 20, wherein the hermetic region includes an inorganic dielectric material.

Example 22 may include the method of example 20, wherein the hermetic region includes silicon, nitrogen, aluminum, or oxygen.

Example 23 may include the method of any of examples 15-19, further comprising forming an interconnect element that extends from the surface of the package substrate, wherein the interconnect element is located within the guard ring, and forming a solder joint coupling the interconnect element to a contact of the component, wherein interconnect element is to provide an electrical connection between the package substrate and the component.

Example 24 may include the method of example 23, wherein forming the interconnect element includes drilling a via in the surface of the package substrate, wherein the via extends into a conductive material of the package substrate, positioning a resist on the surface of the package substrate, the resist having an opening over the via, performing a metal plating procedure that deposits the interconnect element within the opening of the resist, and removing the resist.

Example 25 may include the method of any of examples 15-19, further comprising forming an overmold on the component, wherein the overmold encapsulates the component and the guard ring.

Example 26 may include a computer device, comprising a printed circuit board (PCB), and a package assembly mounted on the PCB, wherein the package assembly includes a package substrate that includes a guard ring, wherein the guard ring extends from a surface of the package substrate and around a circumference of a cavity, and a component coupled to the guard ring by a solder joint along an entirety of the guard ring, wherein the cavity is located between the package substrate and the component and the cavity is hermetically-sealed via the guard ring and the solder joint.

Example 27 may include the computer device of example 26, wherein the package substrate includes a dielectric material that extends within the guard ring and provides hermeticity.

Example 28 may include the computer device of example 27, wherein the dielectric material is located on the surface of the package substrate.

Example 29 may include the computer device of example 27, wherein the dielectric material is an inorganic dielectric material.

Example 30 may include the computer device of example 27, wherein the dielectric material includes silicon, nitrogen, aluminum, or oxygen.

Example 31 may include the computer device of any of examples 26-30, wherein the package substrate further includes an interconnect element located within the guard ring, wherein the interconnect element extends from the surface of the package substrate, is coupled to the component, and provides electrical connectivity between the package substrate and the component.

Example 32 may include the computer device of any of examples 26-30, wherein the guard ring includes a first region located on the surface of the package substrate and a second region located on the first region, and wherein the first region includes copper and the second region includes solder.

Example 33 may include the computer device of any of examples 26-30, wherein the guard ring includes a first region located on the surface of the package substrate, a second region located on the first region, and a third region located on the second region, wherein the first region includes copper, wherein the second region includes a surface finish, and wherein the third region includes solder.

Example 34 may include the computer device of example 33, wherein the surface finish includes nickel, palladium, or gold.

Example 35 may include the computer device of any of examples 26-30, wherein the guard ring includes a first region located on the surface of the package substrate and a second region located on the first region, and wherein the first region includes copper and the second region includes a surface finish.

Example 36 may include the computer device of example 35, wherein the surface finish includes nickel, palladium, or gold.

Example 37 may include the computer device of example 35, wherein the second region further is located on a first side of the first region and a second side of the first region, the second side opposite to the first side, and wherein the first side and the second side extend substantially perpendicularly from the surface of the package substrate.

Example 38 may include the computer device of example 37, wherein the surface finish includes nickel, palladium, or gold.

Example 39 may include the computer device of any of examples 26-30, wherein the component is a device with moving elements (DME), and wherein an element of the DME extends within the cavity.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A package assembly, comprising:
   a package substrate that includes a guard ring, wherein the guard ring extends from a surface of the package substrate and around a circumference of a cavity;
   a first component coupled to the guard ring by a solder joint along an entirety of the guard ring, wherein the cavity is located between the package substrate and the first component and the cavity is hermetically-sealed via the guard ring and the solder joint, and wherein the first component comprises at least a portion of a radio frequency (RF) component; and
   a second component coupled to the first component and extending from the first component into the cavity, wherein the second component includes a per QS microelectromechanical system (MEMS).

2. The package assembly of claim 1, wherein the package substrate includes a dielectric material that extends within the guard ring and provides hermeticity.

3. The package assembly of claim 2, wherein the dielectric material is located on the surface of the package substrate.

4. The package assembly of claim 2, wherein the dielectric material is an inorganic dielectric material.

5. The package assembly of claim 2, wherein the dielectric material includes silicon, nitrogen, aluminum, or oxygen.

6. The package assembly of claim 1, wherein the package substrate further includes an interconnect element located within the guard ring, wherein the interconnect element extends from the surface of the package substrate, is coupled to the component, and provides electrical connectivity between the package substrate and the component.

7. The package assembly of claim 1, wherein the guard ring includes a first region located on the surface of the package substrate and a second region located on the first region, and wherein the first region includes copper and the second region includes solder.

8. The package assembly of claim 1, wherein the guard ring includes a first region located on the surface of the package substrate, a second region located on the first region, and a third region located on the second region, wherein the first region includes copper, wherein the second region includes a surface finish, and wherein the third region includes solder.

9. The package assembly of claim 8, wherein the surface finish includes nickel, palladium, or gold.

10. A method of producing a hermetic cavity within a package assembly, comprising:
    forming a guard ring on a surface of a package substrate, wherein the guard ring is to extend around a circumference of the hermetic cavity;
    forming a stability pillar or a stability beam on the surface of the package substrate, wherein the stability pillar or the stability beam is located within the guard ring;
    positioning a component on the guard ring; and
    forming a solder joint coupling the guard ring and the component, wherein the solder joint hermetically seals the hermetic cavity.

11. The method of claim 10, wherein forming the guard ring includes:
    positioning a resist on the surface of the package substrate, the resist having an opening for the guard ring;
    performing a metal plating procedure that deposits the guard ring within the opening of the resist; and
    removing the resist.

12. The method of claim 11, wherein performing the metal plating procedure includes:
    forming a first region on the surface of the package substrate, the first region including copper; and
    forming a second region on a surface of the first region, the surface of the first region being located on an opposite side of the first region from the surface of the package substrate.

13. The method of claim 12, wherein performing the metal plating procedure further includes:
    forming a third region on a surface of the second region, the surface of the second region being located on an opposite side of the second region from the surface of the first region, wherein the second region includes nickel, palladium, or gold, and wherein the third region includes solder.

14. The method of claim 10, further comprising depositing a hermetic region on the package substrate.

15. A computer device, comprising:
    a printed circuit board (PCB); and
    a package assembly mounted on the PCB, wherein the package assembly includes:
       a package substrate that includes:
          a guard ring that extends from a surface of the package substrate and around a circumference of a cavity; and
          a stability pillar or a stability beam located within the guard ring, wherein the stability pillar or the stability beam extends from the surface of the package substrate
       a component coupled to the guard ring by a solder joint along an entirety of the guard ring, wherein the cavity is located between the package substrate and the component, and the cavity is hermetically-sealed via the guard ring and the solder joint.

16. The computer device of claim 15, wherein the package substrate includes a dielectric material that extends within the guard ring and provides hermeticity.

17. The computer device of claim 16, wherein the dielectric material is located on the surface of the package substrate.

18. The computer device of claim 16, wherein the dielectric material is an inorganic dielectric material.

19. The computer device of claim 16, wherein the dielectric material includes silicon, nitrogen, aluminum, or oxygen.

20. The computer device of claim 15, wherein the package substrate further includes an interconnect element located within the guard ring, wherein the interconnect element extends from the surface of the package substrate, is coupled to the component, and provides electrical connectivity between the package substrate and the component.

\* \* \* \* \*